United States Patent
Shiga et al.

(10) Patent No.: US 11,232,843 B2
(45) Date of Patent: Jan. 25, 2022

(54) NONVOLATILE SEMICONDUCTOR STORAGE DEVICE AND METHOD FOR PERFORMING A READ OPERATION ON THE SAME

(71) Applicant: KIOXIA CORPORATION, Tokyo (JP)

(72) Inventors: Hidehiro Shiga, Yokohama Kanagawa (JP); Takashi Maeda, Kamakura Kanagawa (JP)

(73) Assignee: KIOXIA CORPORATION, Tokyo (JP)

(*) Notice: Subject to any disclaimer, the term of this patent is extended or adjusted under 35 U.S.C. 154(b) by 0 days.

(21) Appl. No.: 17/009,376

(22) Filed: Sep. 1, 2020

(65) Prior Publication Data
US 2021/0280257 A1 Sep. 9, 2021

(30) Foreign Application Priority Data

Mar. 4, 2020 (JP) .............................. JP2020-037061

(51) Int. Cl.
*G11C 16/16* (2006.01)
*G11C 16/26* (2006.01)
*G11C 16/10* (2006.01)
*G11C 16/30* (2006.01)
*G11C 16/08* (2006.01)
*G11C 16/04* (2006.01)
*G11C 16/24* (2006.01)

(52) U.S. Cl.
CPC .......... *G11C 16/26* (2013.01); *G11C 16/0433* (2013.01); *G11C 16/08* (2013.01); *G11C 16/10* (2013.01); *G11C 16/24* (2013.01); *G11C 16/30* (2013.01)

(58) Field of Classification Search
CPC ...... G11C 16/26; G11C 16/0433; G11C 16/08; G11C 16/10; G11C 16/24; G11C 16/30
USPC .................................................. 365/189.011
See application file for complete search history.

(56) References Cited

U.S. PATENT DOCUMENTS

| 7,382,018 B2 | 6/2008 | Kim et al. |
| 10,056,433 B2 | 8/2018 | Kiyotoshi et al. |
| 11,107,508 B2 * | 8/2021 | Hosotani ................ G11C 16/26 |
| 2020/0176033 A1 | 6/2020 | Hosotani et al. |

FOREIGN PATENT DOCUMENTS

JP 2008078404 A 4/2008

* cited by examiner

*Primary Examiner* — Xiaochun L Chen
(74) *Attorney, Agent, or Firm* — Kim & Stewart LLP

(57) ABSTRACT

A nonvolatile semiconductor storage device includes a first channel layer including a first drain-side select transistor, a first source-side select transistor, and a first memory cell transistor, a second channel layer including a second drain-side select transistor, a second source-side select transistor, and a second memory cell transistor, a word line that functions as a gate electrode of the first and second memory cell transistors, and a controller. When a read operation is executed on the first memory cell transistor, the controller turns on the second drain-side select transistor and the second source-side select transistor, supplies a first voltage to the word line in a state where the first drain-side select transistor and the first source-side select transistor are turned off, and then, supplies a second voltage to the word line in a state where the first drain-side select transistor and the first source-side select transistor are turned on.

20 Claims, 10 Drawing Sheets

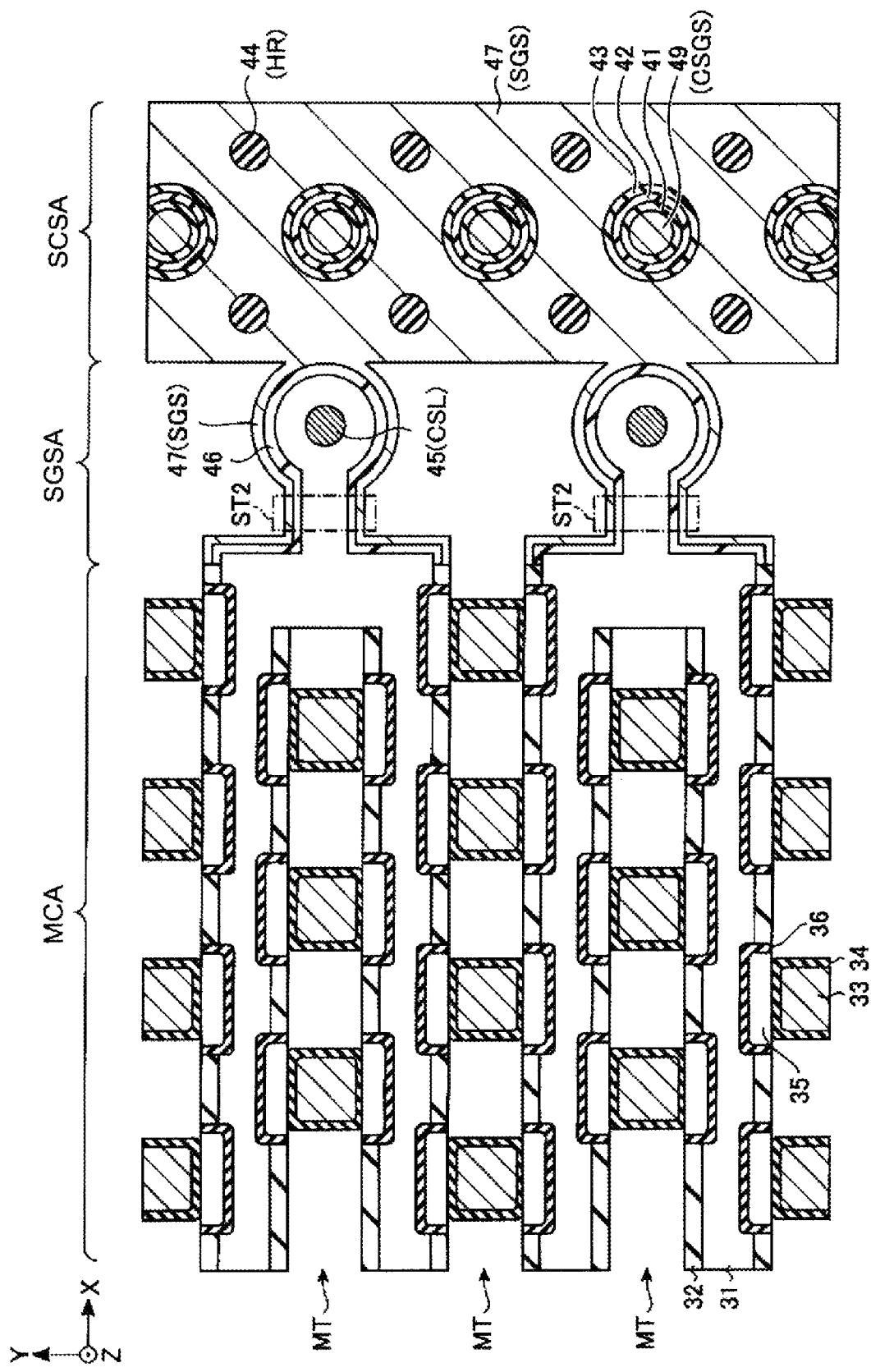

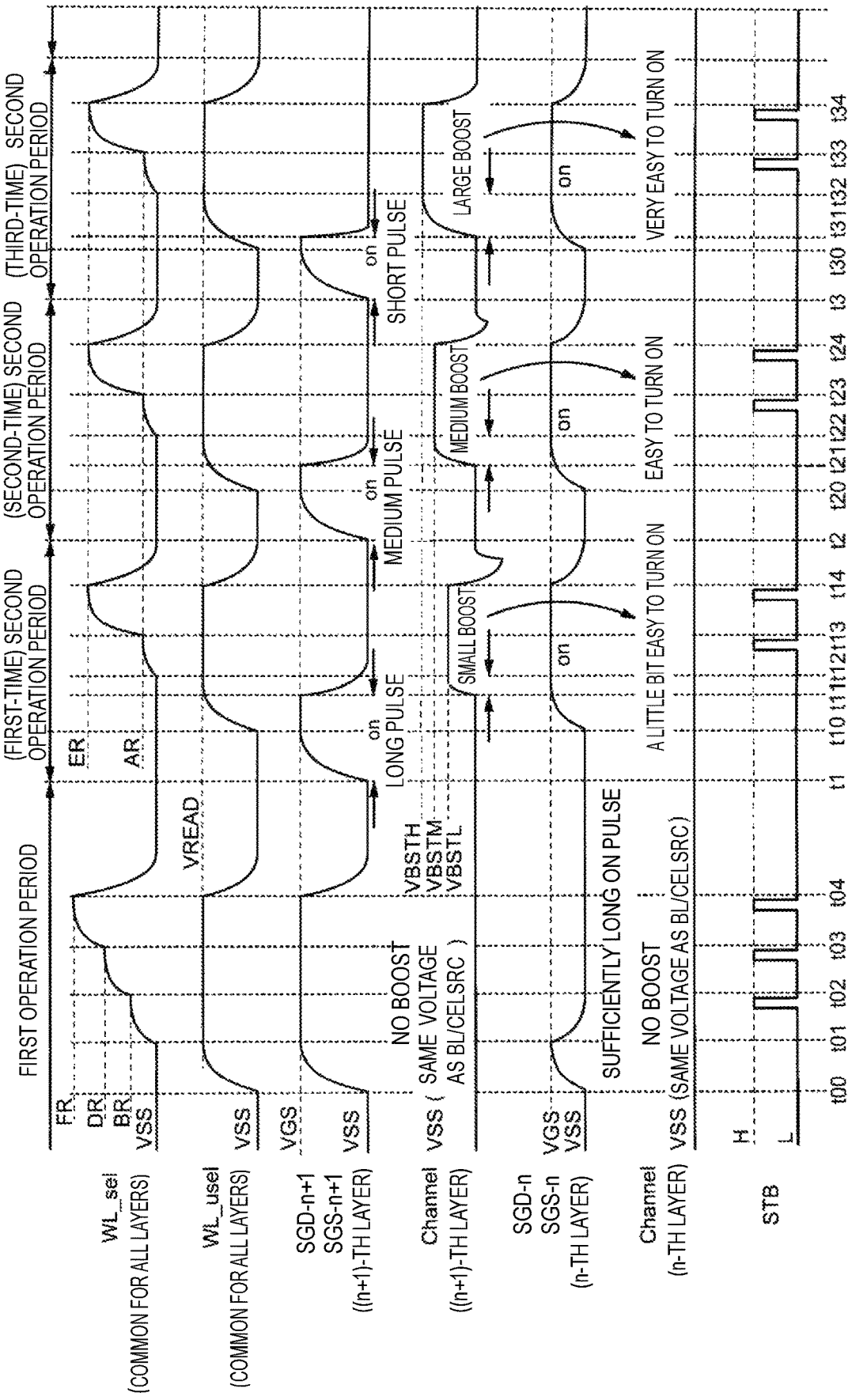

NONVOLATILE SEMICONDUCTOR STORAGE DEVICE AND METHOD FOR PERFORMING A READ OPERATION ON THE SAME

CROSS-REFERENCE TO RELATED APPLICATION(S)

This application is based upon and claims the benefit of priority from Japanese Patent Application No. 2020-037061, filed Mar. 4, 2020, the entire contents of which are incorporated herein by reference.

FIELD

Embodiments described herein relate generally to a nonvolatile semiconductor storage device and a method for performing a read operation on the nonvolatile semiconductor storage device.

BACKGROUND

A NAND type flash memory is known one type of a nonvolatile semiconductor storage device. In order to increase the capacity of the NAND type flash memory, a three-dimensional NAND type flash memory in which multiple memory cells are arranged in a three-dimensional manner has been put to a practical use. Various forms of three-dimensional NAND type flash memory include, for example, a form in which memory strings are vertically formed, and a form in which memory strings are horizontally formed.

BRIEF DESCRIPTION OF THE DRAWINGS

FIGS. 5A and 5B are each a plan view illustrating different examples of a memory cell area and an SGS area of the nonvolatile semiconductor storage device according to the embodiment.

FIG. 9 is a timing chart illustrating a read operation in the nonvolatile semiconductor storage device according to the embodiment.

DETAILED DESCRIPTION

Figure 1:
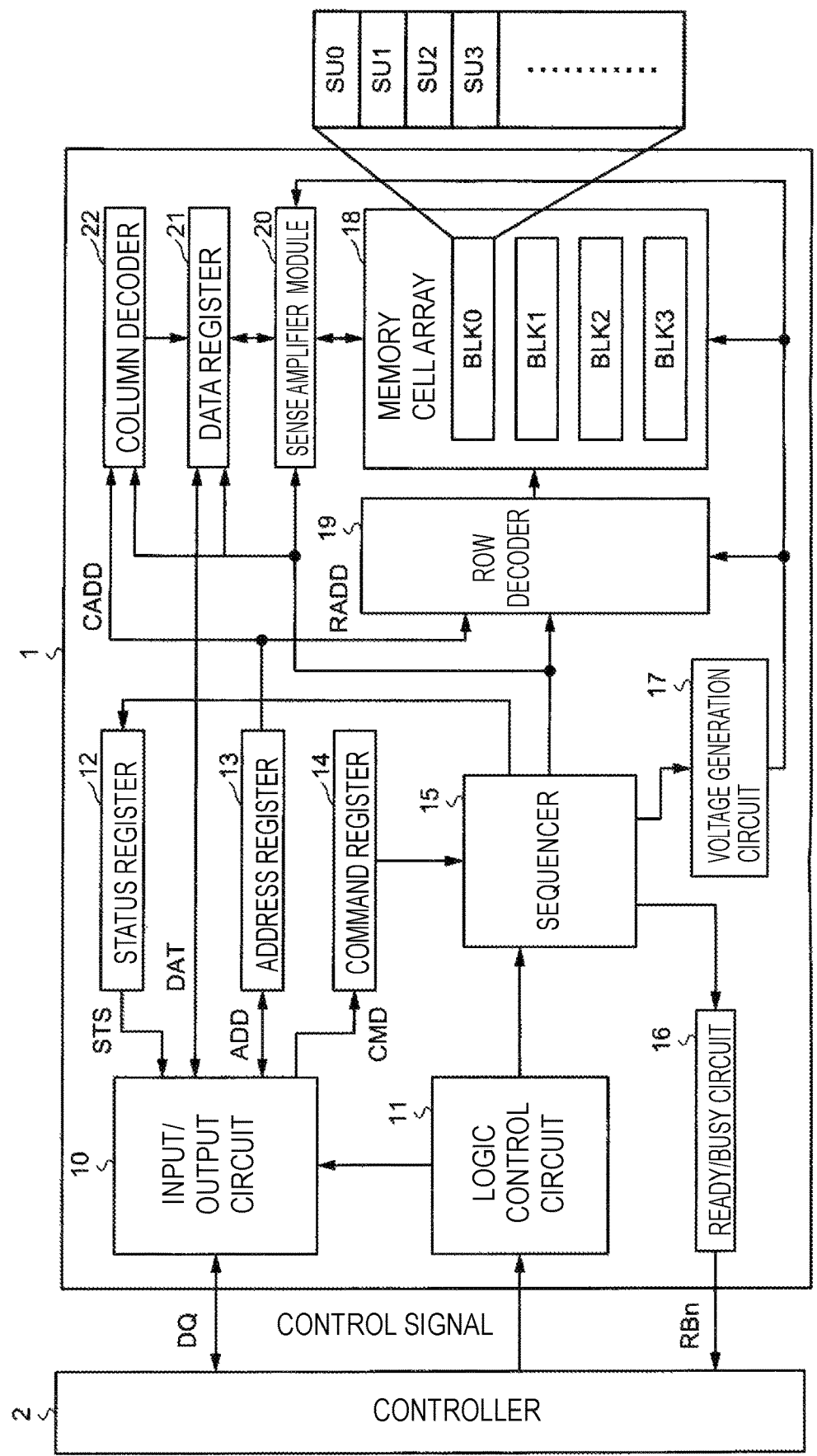
FIG. 1 is a block diagram of a nonvolatile semiconductor storage device according to an embodiment.

Embodiments provide a nonvolatile semiconductor storage device and a method for performing a read operation on the nonvolatile semiconductor storage device.

In general, according to one embodiment, a nonvolatile semiconductor storage device includes: a substrate having a main surface that extends in a first direction and a second direction crossing the first direction; a bit line that extends in a third direction crossing the first and second directions; a source line that extends in the third direction; a first channel layer that is disposed on the one side of the substrate in the third direction, and includes a first drain-side select transistor that is connected to the bit line, a first source-side select transistor that is connected to the source line, and a first memory cell transistor connected between the first drain-side select transistor and the first source-side select transistor; a second channel layer that is disposed on one side of the first channel layer in the third direction, and includes a second drain-side select transistor that is connected to the bit line, a second source-side select transistor connected to the source line, and a second memory cell transistor connected between the second drain-side select transistor and the second source-side select transistor; a word line that is disposed on one side of the first channel layer and the second channel layer in the second direction, extends in the third direction, and functions as a gate electrode of the first memory cell transistor and the second memory cell transistor; and a controller. When a read operation is executed on the first memory cell transistor, the controller executes a first operation to turn on the second drain-side select transistor and the second source-side select transistor, and simultaneously, supply at least one first read voltage to the word line in a state where the first drain-side select transistor and the first source-side select transistor are turned off, and a second operation to supply at least one second read voltage to the word line in a state where at least the first drain-side select transistor and the first source-side select transistor are turned on, after the first operation.

In general, another embodiment is a method for performing a read operation on a first memory cell transistor in a nonvolatile semiconductor storage device that includes: a substrate having a main surface that extends in a first direction and a second direction crossing the first direction; a bit line that extends in a third direction crossing the first and second directions; a source line that is disposed on one side of the substrate in the third direction, and extends in the third direction; a first drain-side select transistor that is disposed on one side of the substrate in the third direction, and connected to the bit line; a first source-side select transistor that is connected to the source line; a first channel layer that includes the first memory cell transistor connected between the first drain-side select transistor and the first source-side select transistor; a second drain-side select transistor that is disposed on one side of the first channel layer in the third direction, and connected to the bit line; a second source-side select transistor connected to the source line; a second channel layer that includes a second memory cell transistor connected between the second drain-side select transistor and the second source-side select transistor; a word line that is disposed on one side of the first channel layer and the second channel layer in the second direction, extends in the third direction, and functions as a gate electrode of the first memory cell transistor and the second memory cell transistor; and a controller. The method includes a first operation to supply at least one first read voltage to the word line in a state where the second drain-side select transistor and the second source-side select transistor are turned on, and simultaneously, turn off the first drain-side select transistor and the first source-side select transistor; and a second operation to supply at least one second voltage to the word line in a state where at least the first drain-side select transistor and the first source-side select transistor are turned on, after the first operation.

Hereinafter, embodiments will be described with reference to the drawings. In the following descriptions, components having the same function and configuration will be denoted by the same reference numerals. When a plurality of components having the same reference numeral needs to be distinguished from each other, a suffix will be added to the common reference numeral. When the plurality of components do not need to be distinguished from each other, the components will be denoted by the common reference numeral without adding a suffix.

In the descriptions and the claims herein (hereinafter, referred to as "the present descriptions and others"), a nonvolatile semiconductor storage device which is one of the embodiments of the present disclosure is, for example, a three-dimensional NAND type flash memory, and more specifically, a three-dimensional NAND type flash memory in which memory strings extend in the horizontal direction.

<1. Entire Configuration>

First, the entire configuration of a nonvolatile semiconductor storage device 1 according to an embodiment will be described. FIG. 1 is a block diagram illustrating the entire basic configuration of the nonvolatile semiconductor storage device 1. In FIG. 1, some of the connections among blocks are indicated by arrow lines. However, the connections among blocks are not limited to the ones illustrated in FIG. 1.

As illustrated in FIG. 1, the nonvolatile semiconductor storage device 1 includes an input/output circuit 10, a logic control circuit 11, a status register 12, an address register 13, a command register 14, a sequencer 15, a ready/busy circuit 16, a voltage generation circuit 17, a memory cell array 18, a row decoder 19, a sense amplifier module 20, a data register 21, and a column decoder 22.

The input/output circuit 10 controls an input (reception) of a signal DQ from an external controller 2 and an output (transmission) of a signal DQ to the external controller 2. The signal DQ includes, for example, data DAT, an address ADD, and a command CMD. The input/output circuit 10 transmits data DAT received from the external controller 2 to the data register 21, transmits an address ADD received from the external controller 2 to the address register 13, and transmits a command CMD received from the external controller 2 to the command register 14. Further, the input/output circuit 10 transmits status information STS received from the status register 12, data DAT received from the data register 21 and others, to the external controller 2.

The logic control circuit 11 receives various control signals from the external controller 2. The logic control circuit 11 controls the input/output circuit 10 and the sequencer 15 according to a received control signal.

The status register 12 temporarily stores status information STS during, for example, a write operation, a read operation, and an erase operation, and notifies the external controller 2 of whether each operation has normally completed.

The address register 13 temporarily stores a received address ADD. The address register 13 transfers a row address RADD to the row decoder 19, and transfers a column address CADD to the column decoder 22.

The command register 14 temporarily stores a received command CMD, and transfers the command CMD to the sequencer 15.

The sequencer 15 controls the entire operation of the nonvolatile semiconductor storage device 1. The sequencer 15 controls, for example, the status register 12, the ready/busy circuit 16, the voltage generation circuit 17, the row decoder 19, the sense amplifier module 20, the data register 21, the column decoder 22 and others, according to a received command CMD, so as to execute the write operation, the read operation, the erase operation and others. In the present descriptions and others, the sequencer 15 may be referred to as a controller.

The ready/busy circuit 16 transmits a ready/busy signal RBn to the external controller 2 according to the operation status of the sequencer 15.

The voltage generation circuit 17 generates a voltage required for the write operation, the read operation, and the erase operation under the control of the sequencer 15, and supplies the generated voltage to, for example, the memory cell array 18, the row decoder 19, the sense amplifier module 20 and others. The row decoder 19 and the sense amplifier module 20 apply the voltage supplied from the voltage generation circuit 17 to a memory cell transistor in the memory cell array 18.

The memory cell array 18 includes a plurality of blocks BLK (BLK0 to BLK3, . . . ) that each includes a plurality of nonvolatile memory cell transistors (hereinafter, also referred to as "memory cells") that are associated with rows and columns. Each block BLK includes a plurality of string units SU (SU0 to SU3, Each string unit SU includes a plurality of memory groups MG (memory string pairs). The number of blocks BLK in the memory cell array 18, the number of string units SU in the block BLK, and the number of memory groups MG in the string unit SU are not limited to any particular number. The details of the memory cell array 18 will be described later.

The row decoder 19 decodes the row address RADD. The row decoder 19 applies a required voltage to the memory cell array 18 based on the decoding result.

During the read operation, the sense amplifier module 20 senses data read from the memory cell array 18, and transmits the sensed and read data to the data register 21. In addition, during the write operation, the sense amplifier module 20 transmits write data to the memory cell array 18.

The data register 21 includes a plurality of latch circuits. The latch circuits temporarily store write data or read data.

For example, during the write operation, the read operation, and the erase operation, the column decoder 22 decodes the column address CADD, and selects a latch circuit in the data register 21 according to the decoding result.

<2. Circuit Configuration of Memory Cell Array>

Figure 2:
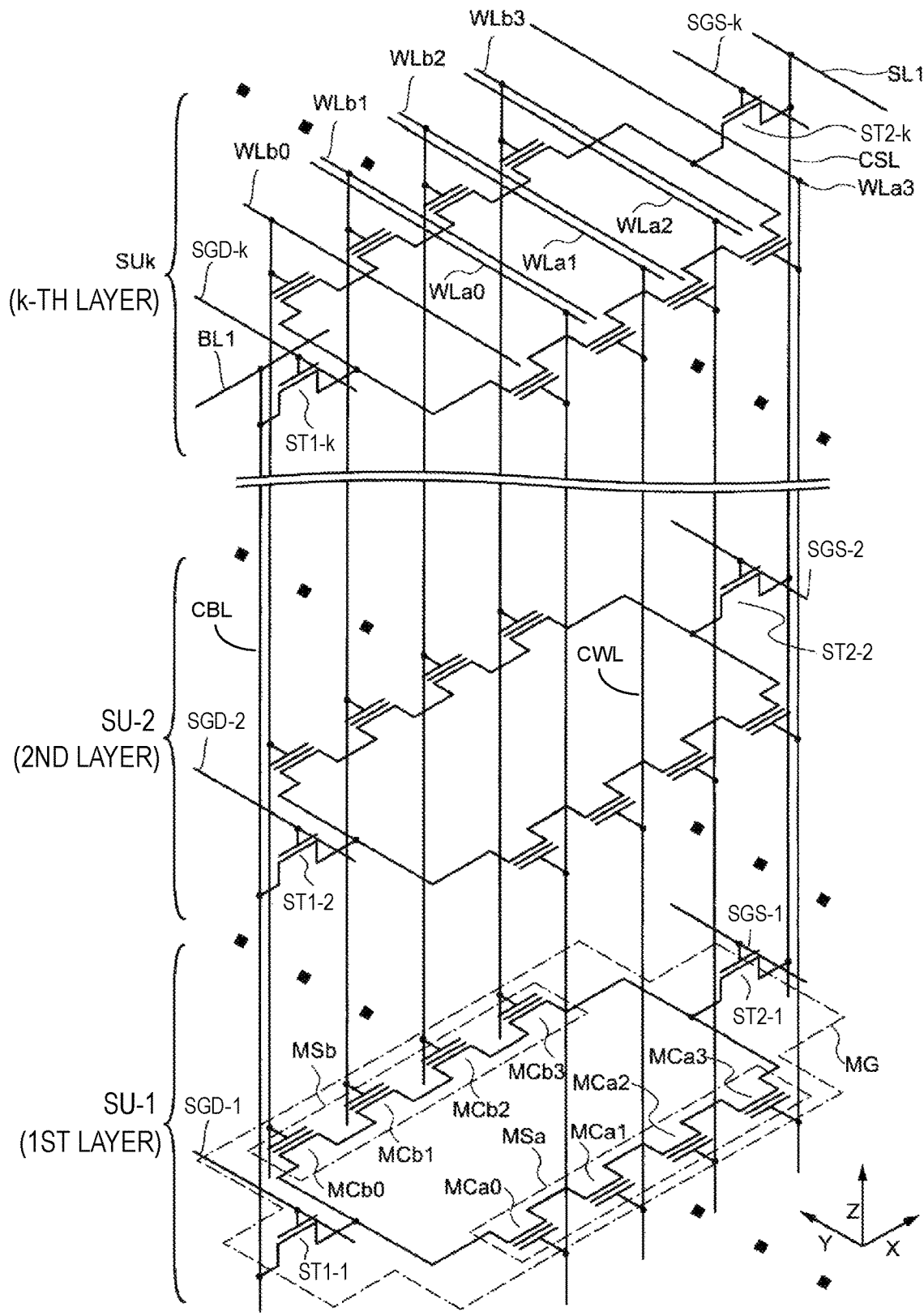
FIG. 2 is a circuit diagram of a memory cell array provided in the nonvolatile semiconductor storage device according to the embodiment.

Next, the circuit configuration of the memory cell array 18 will be described. FIG. 2 represents an example of a circuit diagram of the memory cell array 18. The circuit configuration of the memory cell array 18 is given as an example, and the circuit configuration of the memory cell array 18 of the nonvolatile semiconductor storage device according to the present embodiment is not limited to the example illustrated in FIG. 2. The descriptions of the same or similar configuration as those shown in FIG. 1 may be omitted.

Figure 4:
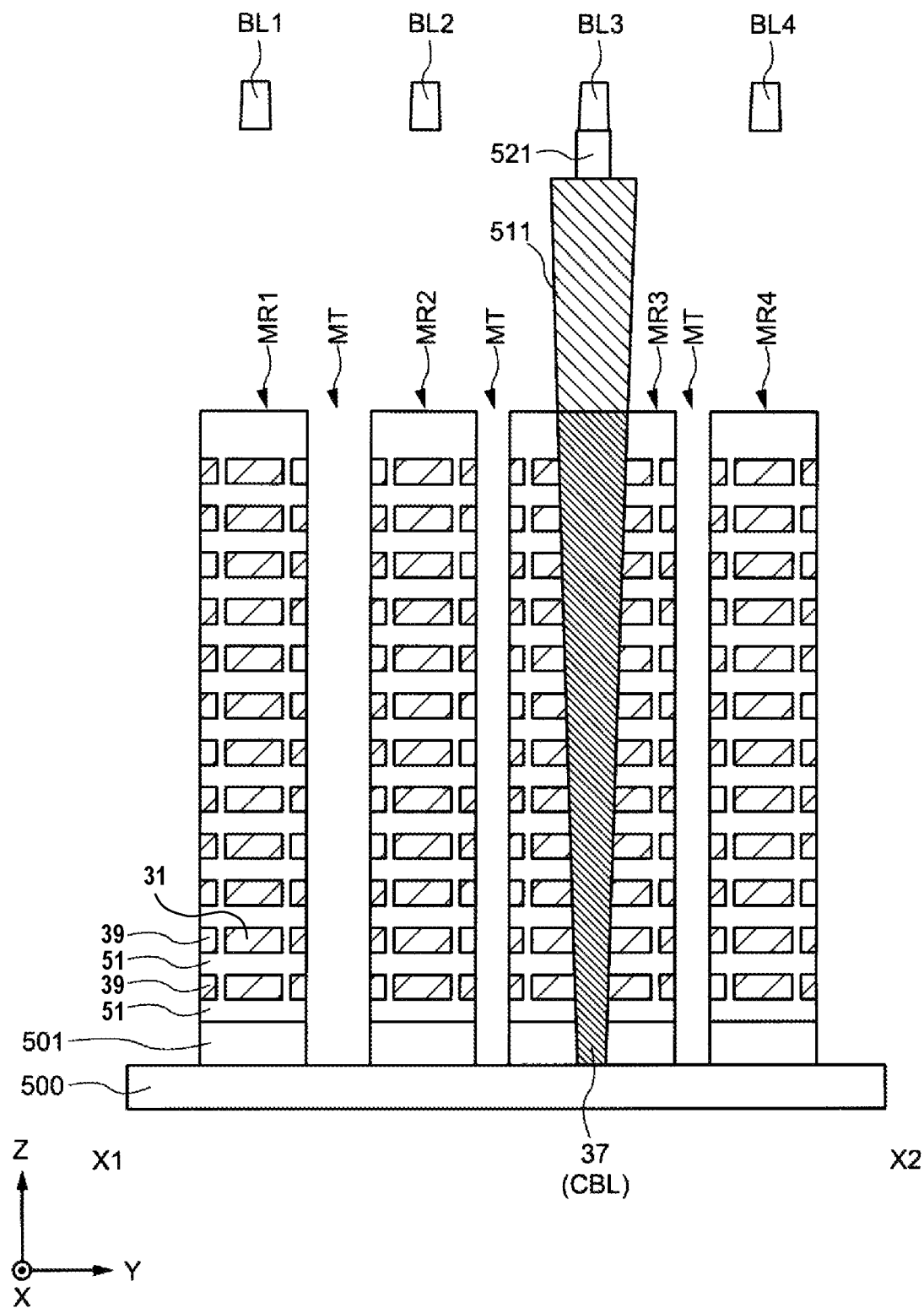
FIG. 4 is a cross-sectional view of the SGD area of the nonvolatile semiconductor storage device according to the embodiment.

As described above, the memory cell array 18 includes a plurality of blocks BLK, each block BLK including a plurality of string units SU, and each string unit SU including a plurality of memory groups MG (memory string pairs). FIG. 2 represents a plurality of memory groups MG that corresponds to a plurality of semiconductor layers stacked in the Z direction and commonly connected to a bit line that includes a bit line contact CBL. The plurality of memory groups MG represented in FIG. 2 correspond to, for example, the areas separated by memory trenches MT as illustrated in FIG. 4 (memory components MR1 to MR4, respectively). In the present descriptions and others, the semiconductor layers correspond to the string units SU, respectively. In the following description, the drain of a select gate line that corresponds to the uppermost semiconductor layer 31 will be referred to as SGD-*k* (where k is a natural number of 2 or more), and the source thereof will be referred to as SGS-k. The drain of a select gate line that corresponds to the lowermost semiconductor layer 31 will be referred to as SGD-1, and the source thereof will be referred to as SGS-1. The drain of a select gate line that corresponds to the semiconductor layer 31 stacked on the lowermost semiconductor layer 31 will be referred to as SGD-2, and the source thereof will be referred to as SGS-2. In the present descriptions and others, a semiconductor layer may be referred to as a channel layer.

As illustrated in FIG. 2, the memory cell array 18 includes a plurality of memory groups MG. The semiconductor layers 31 (the string units SU) stacked in the Z direction include the plurality of memory groups MG separated from each other in the Y direction, respectively. Each memory group MG includes two memory strings MSa and MSb and select transistors ST1 and ST2. Hereinafter, when the memory strings MSa and MSb do not need to be distinguished from each other, the memory strings will be referred to as memory strings MS. In the present descriptions and others, the select transistor ST1 may be referred to as a drain-side select transistor, and the select transistor ST2 may be referred to as a source-side select transistor.

The memory string MSa includes, for example, four memory cell transistors MCa0 to MCa3. Similarly, the memory string MSb includes, for example, four memory cell transistors MCb0 to MCb3. Hereinafter, when the memory cell transistors MCa0 to MCa3 and MCb0 to MCb3 do not need to be distinguished from each other, the memory cell transistors will be referred to as memory cell transistors MC.

Each memory cell transistor MC includes a control gate and a charge storage layer, and stores data in a nonvolatile manner. The memory cell transistor MC may be an MONOS type memory cell transistor in which an insulating layer is used for the charge storage layer, or an FG type memory cell transistor in which a conductive layer is used for the charge storage layer. In the present embodiment described hereinafter, the FG type memory cell transistor will be described as an example. The number of memory cell transistors MC in each memory string MS may be, for example and without limitation, 8, 16, 32, 48, 64, 96, or 128.

The current paths of the memory cell transistors MCa0 to MCa3 in the memory string MSa are connected to each other in series. Similarly, the current paths of the memory cell transistors MCb0 to MCb3 in the memory string MSb are connected to each other in series. The drains of the memory cell transistors MCa0 and MCb0 are commonly connected to the source of the select transistor ST1. The sources of the memory cell transistors MCa3 and MCb3 are commonly connected to the drain of the select transistor ST2. In addition, the number of select transistors ST1 and ST2 in the memory group MG is selected without limitation, and the number of select transistors ST1 or ST2 may be one or more. For example, the memory cell transistors MCa0 to MCa3 and MCb0 to MCb3 may function as one memory string, according to the dimension of the semiconductor layer 31 that functions as a channel layer to be described later. That is, the memory cell transistors MCb0, MCa0, MCb1, MCa1, MCb2, MCa2, MCb3, and MCa3 may function as one memory string in which the memory cell transistors are connected to each other in series.

The gates of the memory cell transistors MC of the plurality of memory groups MG arranged along the Z direction are commonly connected to one word line WL via a contact plug CWL. For example, the gates (gate electrodes) of the plurality of memory cell transistors MCa0 arranged along the Z direction are commonly connected to a word line WLa0. Similarly, the gate electrodes of the memory cell transistors MCa1, MCa2, and MCa3 are connected to word lines WLa1, WLa2, and WLa3, respectively. The gates of the memory cell transistors MCb0 to MCb3 are connected to word lines WLb0 to WLb3, respectively.

Figure 3:
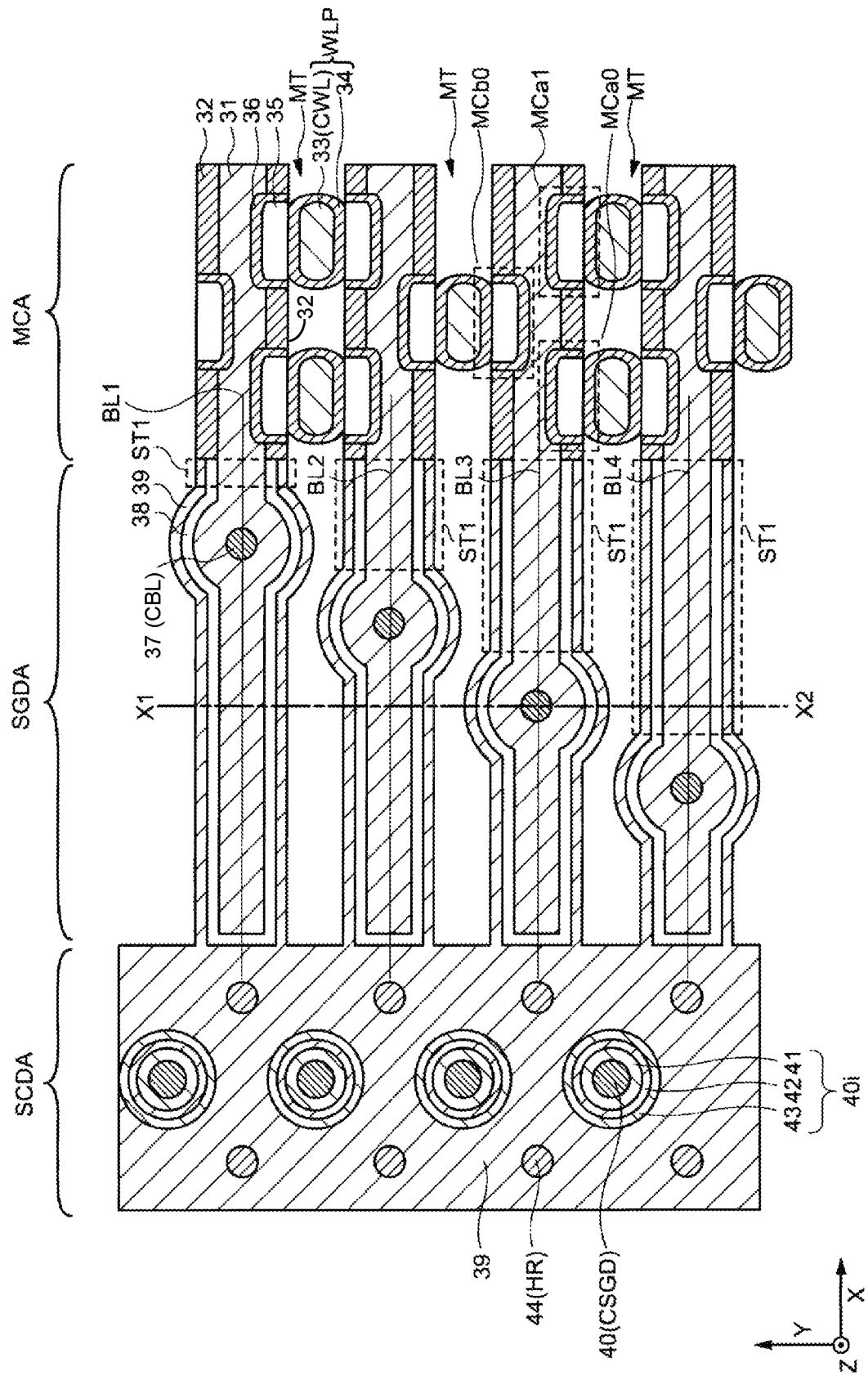
FIG. 3 is a plan view illustrating a memory cell area and an SGD area of the nonvolatile semiconductor storage device according to the embodiment.

As illustrated in FIG. 3, the drains of the select transistors ST1 of the plurality of memory groups MG arranged along the Z direction are commonly connected to a corresponding bit line BL through the bit line contact CBL thereof. The gate electrodes of the select transistors ST1 of the plurality of memory groups MG arranged along the Z direction are connected to different select gate lines SGD, respectively. For example, the gate electrode of the select transistor ST1 that corresponds to the memory group MG disposed in the uppermost layer is connected to the select gate line SGD-k. The gate electrode of the select transistor ST1 that corresponds to the memory group MG disposed in the lowermost layer is connected to the select gate line SGD-1.

Figure 5A:
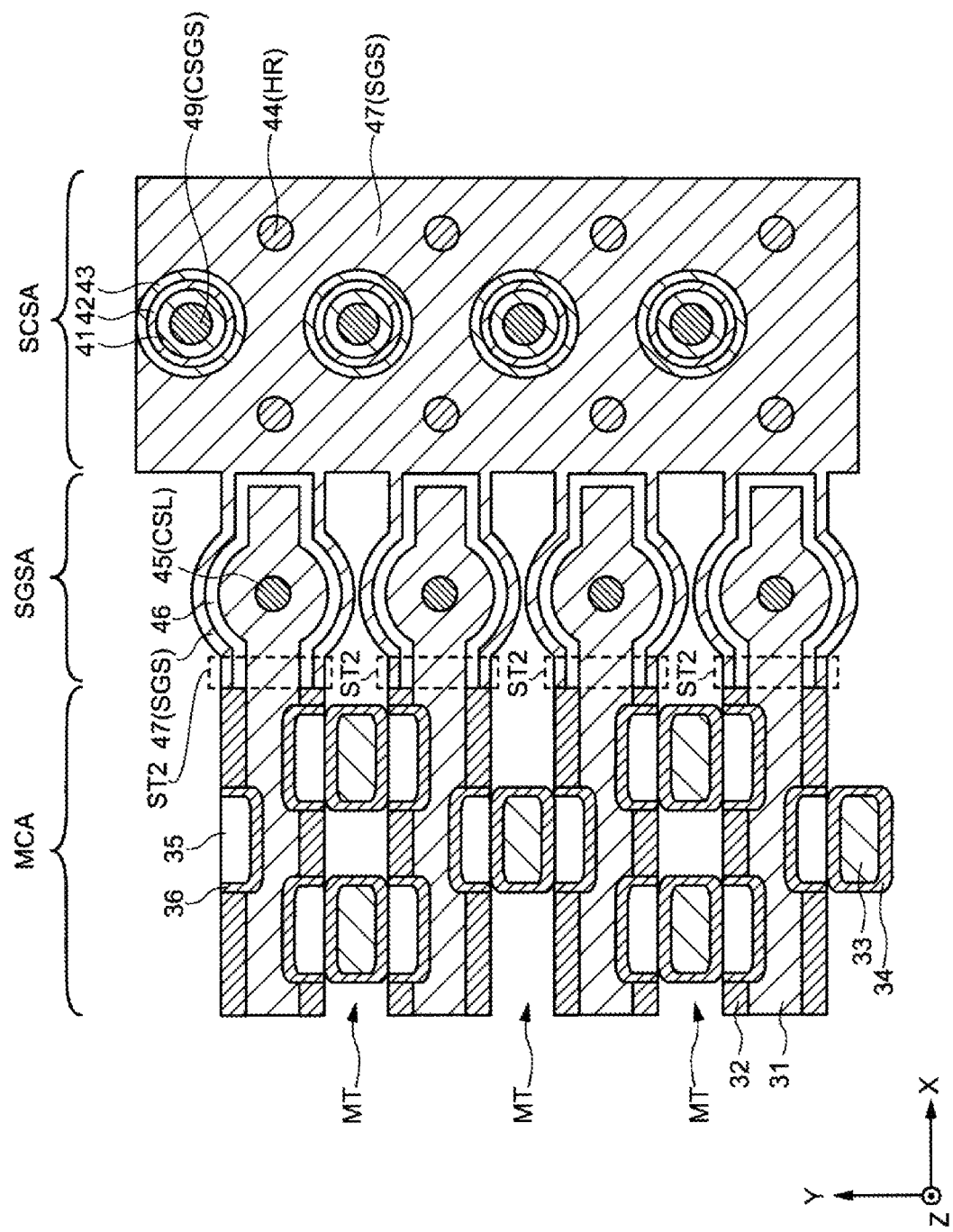

The sources of the select transistors ST2 of the plurality of memory groups MG arranged along the Z direction are commonly connected to one source line SL1 through a source line contact plug thereof (the source line contact plug CSL; a conductive layer 45; see FIG. 5A). The gate electrodes of the select transistors ST2 of the plurality of memory groups MG arranged along the Z direction are connected to different select gate lines SGS, respectively.

In the nonvolatile semiconductor storage device 1 according to the present embodiment, the plurality of memory groups MG arranged along the Z direction as illustrated in FIG. 2 are arranged along the Y direction. For example, the nonvolatile semiconductor storage device 1 according to the present embodiment has the plurality of memory groups MG arranged along the Z direction illustrated in FIG. 2 as one memory structure (referred to herein as a memory ridge), and includes a first memory structure MR1, a second memory structure MR2 disposed adjacent to the first memory structure MR1 along the Y direction, a third memory structure MR3 disposed adjacent to the second memory structure MR2 along the Y direction, and a fourth memory structure MR4 disposed adjacent to the third memory structure MR3 along the Y direction, as illustrated in FIG. 4.

In the first memory structure MR1, the drains of the select transistors ST1 of the plurality of memory groups MG arranged along the Z direction are commonly connected to one bit line BL1 through a bit line contact plug thereof (the contact plug CBL (a conductive layer 37)). Further, in the first memory structure MR1, the sources of the select transistors ST2 of the plurality of memory groups MG arranged along the Z direction are commonly connected to one source line SL1 (not illustrated) through a source line contact plug thereof (the source line contact plug CSL; the conductive layer 45; see FIG. 5A). In the second memory structure MR2, the drains of the select transistors ST1 of the plurality of memory groups MG arranged along the Z direction are commonly connected to one bit line BL2 through a bit line contact thereof (the contact plug CBL (the conductive layer 37)). Further, in the second memory structure MR2, the sources of the select transistors ST2 of the plurality of memory groups MG arranged along the Z direction are commonly connected to one source line SL2

(not illustrated) through a source line contact plug thereof (the source line contact plug CSL; a conductive layer 45; see FIG. 5A).

In the third memory structure MR3, the drains of the select transistors ST1 of the plurality of memory groups MG arranged along the Z direction are commonly connected to one bit line BL3 through a bit line contact thereof (the contact plug CBL (the conductive layer 37)), and the sources of the select transistors ST2 of the plurality of memory groups MG arranged along the Z direction are commonly connected to one source line SL3 (not illustrated) through a source line contact plug thereof (the source line contact plug CSL; the conductive layer 45; see FIG. 5A). In the fourth memory structure MR4, the drains of the select transistors ST1 of the plurality of memory groups MG arranged along the Z direction are commonly connected to one bit line BL4 through a bit line contact thereof (the contact plug CBL (the conductive layer 37), and the sources of the select transistors ST2 of the plurality of memory groups MG arranged along the Z direction are commonly connected to one source line SL4 (not illustrated) through a source line contact plug thereof (the source line contact plug CSL; the conductive layer 45; see FIG. 5A).

The plurality of semiconductor layers 31 are stacked along the Z direction. Each of the semiconductor layers 31 is separated in the Y direction by memory trenches MT that extend in the X direction. The semiconductor layers 31 separated in the Y direction in the respective layers extend in the Z and X directions, so as to form the memory groups MG. As a result, the respective semiconductor layers 31 form the plurality of memory groups MG arranged in the Y direction. Here, for example, the lowermost semiconductor layer 31 is a 1st semiconductor layer 31, the semiconductor layer 31 stacked on the lowermost semiconductor layer 31 is a 2nd semiconductor layer 31, and the uppermost semiconductor layer 31 is a k-th semiconductor layer 31.

As illustrated in FIGS. 1, 2, 3, and 4 to be described later, the nonvolatile semiconductor storage device 1 according to the present embodiment includes: a substrate (not illustrated) having a main surface that extends in the X direction and the Y direction crossing the X direction; a bit line BL1 including a bit line contact CBL that extends in the Z direction crossing the X and Y directions; a source line SL1 including a source line contact CSL that extends in the Z direction; a select transistor ST1-1 that is disposed on one side of the substrate in the Z direction, and extends in the X direction to be connected to the bit line BL1; a select gate line SGD-1 connected to a gate of the select transistor ST1-1; a select transistor ST2-1 that is connected to the source line SL1; a select gate line SGS-1 connected to a gate of the select transistor ST2-1; the 1st semiconductor layer 31 that includes the memory cell transistor MCa0 connected between the select transistor ST1-1 and the select transistor ST2-1; a select transistor ST1-2 that is disposed on one side of the 1st semiconductor layer 31 in the Z direction, and extends in the Y direction to be connected to the bit line BL1; a select gate line SGD-2 connected to a gate of the select transistor ST1-2; a select transistor ST2-2 connected to the source line SL1; a select gate line SGS-2 connected to a gate of the select transistor ST2-2; the 2nd semiconductor layer 31 that includes a memory cell transistor connected between the select transistor ST1-2 and the select transistor ST22; a word line WLa0 that is disposed on one side of the 1st semiconductor layer 31 and the 2nd semiconductor layer 31 in the Y direction (on the right side of the plane), extends in the Z direction, and functions as a gate electrode of the memory cell transistor MCa0 in the 1st semiconductor layer 31 and as a gate electrode of the memory cell transistor in the 2nd semiconductor layer 31; and a sequencer.

As a generalization, the nonvolatile semiconductor storage device 1 according to the present embodiment includes: a select transistor ST1-$n$ that is on the one side of the substrate in the Z direction, and that is connected to the bit line BL1; a select gate line SGD-n connected to a gate of the select transistor ST1-$n$; a select transistor ST2-$n$ that is disposed on the one side of the substrate in the Z direction, and that is connected to the source line SL1; a select gate line SGS-n connected to a gate of the select transistor ST1-$n$; an n-th semiconductor layer 31 that includes a memory cell transistor MCa0 connected between the select transistor ST1-$n$ and the select transistor ST2-$n$; a select transistor ST1-$n$+1 that is disposed on the one side of the select transistor ST1-$n$ in the Z direction, and that is connected to the bit line BL1; a select gate line SGD-n+1 connected to a gate of the select transistor ST1-$n$+1; a select transistor ST2-$n$+1 that is disposed on the one side of the select transistor ST2-$n$ in the Z direction, and that is connected to the source line SL1; a select gate line SGS-n+1 connected to a gate of the select transistor ST2-$n$+1; an (n+1)-th semiconductor layer 31 that includes a memory cell transistor MCa0 connected between the select transistor ST1-$n$+1 and the select transistor ST2-$n$+1; and a word line that is disposed on one side of the n-th semiconductor layer 31 and the (n+1)-th semiconductor layer 31 in the Y direction, that extends in the Z direction, and that functions as the gate electrode of the memory cell transistor MCa0 in n-th semiconductor layer 31 and as the gate electrode of the memory cell transistor MCa0 in (n+1)-th semiconductor layer 31. n is a natural number less than k. For example, the n-th semiconductor layer 31 may correspond to the 1st semiconductor layer 31 shown in FIG. 2, and the (n+1)-th semiconductor layer 31 may correspond to the 2-st semiconductor layer 31 shown in FIG. 2.

<3. Structure of Memory Cell Area, SGD Area, and Stepwise Contact Area>

Next, descriptions will be made on an example of a planar configuration and a cross-sectional configuration of the memory cell array 18 in a memory cell area MCA, an SGD area SGDA, and a stepwise contact area SCDA corresponding to the select gate line SGD. FIG. 3 is a cross-sectional view of the memory cell area MCA and the SGD area SGDA of the memory cell array 18. The configuration illustrated in FIG. 3 is an example, and the configuration of the memory cell array 18 of the nonvolatile semiconductor storage device according to the present embodiment is not limited to the example illustrated in FIG. 3. The descriptions of the same or similar configuration as that shown in FIGS. 1 and 2 may be omitted.

As illustrated in FIG. 3, a memory trench MT is provided between the two semiconductor layers 31 arranged along the Y direction. An insulating layer (not illustrated) is embedded in the memory trench MT.

In the memory cell area MCA, an insulating layer 32 is formed on the side surfaces of the semiconductor layer 31. The insulating layer 32 functions as an etch stop layer when an insulating layer 36 (which is a tunnel insulating film) and a charge storage layer 35 to be described later are formed.

Further, in the memory cell area MCA, a plurality of word line pillars WLP separate the memory trench MT. Each word line pillar WLP includes a conductive layer 33 that extends in the Z direction and an insulating layer 34 in contact with the side surface of the conductive layer 33. The conductive layer 33 functions as the contact plug CWL. The insulating layer 34 functions as a block insulating film of the memory cell transistor MC.

In the XY plane (when viewed in the Z direction), the charge storage layer 35 and the insulating layer 36 are formed between the word line pillar WLP and the semiconductor layer 31 in the Y direction, to divide the insulating layer 32 in the X direction. The insulating layer 36 functions as a tunnel insulating film. In the XY plane, the charge storage layer 35 have two longer side surfaces extending in the X direction and the other two shorter side surfaces extending in the Y direction. One of the two longer side surfaces of the charge storage layer 35 extending in the X direction faces and is in contact with the insulating layer 34 of the word line pillar WLP in the Y direction, and the remaining side surfaces thereof (the other one of the two longer side surface extending in the X direction; and the two shorter side surfaces extending in the Y direction) are surrounded by and in contact with the insulating layer 36. A portion of the side surface of the insulating layer 36 is in contact with the semiconductor layer 31 and the insulating layer 32.

Accordingly, the insulating layer 34, the charge storage layer 35, and the insulating layer 36 are formed in this order from the conductive layer 33 toward the semiconductor layer 31 between the conductive layer 33 and the semiconductor layer 31. The area that includes a portion of the semiconductor layer 31, a portion of the conductive layer 33, a portion of the insulating layer 34, the charge storage layer 35, and the insulating layer 36 (also referred to as an intersecting area of the semiconductor layer 31 and the word line pillar WLP) functions as the memory cell transistor MC. In the example of FIG. 3, in one semiconductor layer 31, the intersecting area of the semiconductor layer 31 and the word line pillar WLP provided below the semiconductor layer 31 in the page of FIG. 3 functions as the memory cell transistor MCa, and the intersecting area of the semiconductor layer 31 and the word line pillar WLP provided above the semiconductor layer 31 in the page of FIG. 3 functions as the memory cell transistor MCb. For example, the plurality of memory cell transistors MCa corresponding to one semiconductor layer 31 will be denoted by MCa0, MCa1, ... in this order from the SGD area SGDA toward the SGS area SGSA. The same applies to the memory cell transistors MCb0, MCb1, ....

In the SGD area SGDA, a conductive layer 37 penetrates the semiconductor layer 31. The conductive layer 37 functions as the contact plug CBL. In the example represented in FIG. 3, the semiconductor layer 31 has a circular shape at the connection area with the conductive layer 37. Alternatively, the shape of the semiconductor layer 31 may be any shape at the connection area with the conductive layer 37. For example, the shape of the connection area may be a polygon. The connection area may have a shape with a sufficient margin in the XY plane, such that the hole of the contact plug CBL is surrounded by the semiconductor layer 31 even though there is manufacturing variation or the like when the hole of the contact plug CBL is processed to penetrate the semiconductor layer 31.

In the SGD area SGDA, an insulating layer 38 surrounds the side surface of the semiconductor layer 31, that is, formed in contact with the end of the semiconductor layer 31 in the X direction and both side surfaces of the semiconductor layer 31 in the Y direction. The insulating layer 38 has an arc shape that follows the circular shape of the semiconductor layer 31. The insulating layer 38 functions as a gate insulating film of the select transistors ST1-1 to ST1-$k$. The insulating layer 38 is also in contact with a conductive layer 39, which is at the side surface of the insulating layer 38 opposite to the side surface in contact with the semiconductor layer 31. A conductive material is used for the conductive layer 39. The conductive material may be, for example, a metal material or an impurity-added semiconductor such as Si, more specifically, phosphorus (P)-added polysilicon. Further, $SiO_2$ may be used for the insulating layer 38. The insulating layer 38 is, however, preferably made of an SiON film. Further, when it is necessary to adjust the threshold values of the select transistors ST1-1 to ST1-$k$, the insulating layer 38 may be formed of an ONO film having a three-layer structure of $SiO_2/SiN/SiO_2$, instead of the SiON film.

The conductive layer 39 functions as the select gate lines SGD-1 to SGD-k. The conductive layer 39 extends along the side surface of insulating layer 38 in the X direction, in the SGD area SGDA. The conductive layer 39 includes a first portion that extends between the memory cell area MCA and the arc shape of the insulating layer 38, and a second portion that is connected to the first portion and has an arc shape that follows the arc shape of the insulating layer 38.

In the SGD area SGDA, the area including the semiconductor layer 31 from the memory cell area MCA to the conductive layer 37, the insulating layer 38, and the first portion of the conductive layer 39 functions as the select transistor ST1. The second portion of the conductive layer 39 functions as the gate electrode of the select transistor ST1, and the insulating layer 38 functions as the gate insulating film of the select transistor ST1, so that the channel of the select transistor ST1 is formed in the semiconductor layer 31. Accordingly, the select transistors ST1 that correspond to the four adjacent contact plugs CBL have different gate lengths.

In the stepwise contact area SCDA, the conductive layer 39 is stacked in plurality in the Z direction, and a conductive layer 40 and an insulating layer 44 penetrate the conductive layers 39. The conductive layer 40 functions as a contact plug CSGD. The insulating layer 44 functions as a dummy pillar HR. The conductive layer 40 is electrically connected to a corresponding one of the conductive layers 39 stacked in the Z direction. An insulating layer 40$i$ is formed between the conductive layer 39 and the conductive layer 40 that are not electrically connected to each other. The insulating layer 40$i$ is made up by insulating layers 41, 42, and 43. The insulating layer 41 is formed in contact with an outer surface of the conductive layer 40. The insulating layer 42 is formed in contact with a portion of the outer surface of the insulating layer 41. The insulating layer 43 is formed in contact with the outer surface of the insulating layer 42. A conductive material is used for the conductive layer 40. The conductive material may be, for example, a metal material, and more specifically, W or TiN may be used.

<4. Cross-Sectional Structure of SGD Area>

FIG. 4 is an example of the cross-sectional view of the SGD area SGDA of the memory cell array 18. The cross-sectional configuration illustrated in FIG. 4 is given as an example, and the cross-sectional configuration of the memory cell array 18 of the nonvolatile semiconductor storage device according to the present embodiment is not limited to the example illustrated in FIG. 4. The descriptions of the same or similar configuration as that shown in FIGS. 1 to 3 may be omitted.

FIG. 4 represents a state where SGD-1 to SGD-$k$ are connected to the memory strings, respectively. An insulating layer 501 is formed on an insulating layer 500 on a semiconductor substrate (not illustrated). An insulating layer 51 and the semiconductor layer 31 are alternately stacked on the insulating layer 501. A hole penetrates the stacked structure such that the bottom surface of the hole reaches the insulating layer 500, and the conductive layer 37 is formed in the hole. The conductive layer 37 is formed of, for example, n+ type polysilicon in which P (phosphorus) or As (arsenic) is doped in high concentration, metal such as W (tungsten) or TiN (titanium nitride), or metal nitride. Since the conductive layer 37 connects the plurality of layers to each other, the conductive layer 37 functions as a HU (hookup) layer. The conductive layer 37 forms, for example, the contact plug CBL of the bit line.

The conductive layer 37 is connected to the conductive layer 511, and is connected to a horizontally-extending bit line BL via a conductive plug 521. In this way, each horizontally extending bit line BL is connected to the contact plug CBL. While FIG. 4 represents only the connection between the horizontally-extending bit line BL3 and the conductive layer 37, similarly to the horizontally-extending bit line BL3, the other horizontally-extending bit lines BL1, BL2, and BL4 are also connected to the bit line contacts thereof via their corresponding conductive layers and conductive plugs.

<5. Structure of Memory Cell Area, SGS Area, and Stepwise Contact Area>

Next, descriptions will be made of an example of a planar configuration of the memory cell array 18 in the memory cell area MCA, the SGS area SGSA, and a stepwise contact area SCSA corresponding to the select gate line SGS. FIGS. 5A and 5B represent examples of plan views illustrating the memory cell area MCA and the SGS area SGSA of the memory cell array 18. The planar configurations illustrated in FIGS. 5A and 5B are given as examples, and the planar configuration of the memory cell array 18 of the nonvolatile semiconductor storage device according to the present embodiment is not limited to the examples illustrated in FIGS. 5A and 5B. The descriptions of the same or similar configuration as that shown in FIGS. 1 and 4 may be omitted.

As illustrated in FIG. 5A, in the memory cell area MCA and the SGS area SGSA of the memory cell array 18, for example, four semiconductor layers 31 are provided in the vicinity of the SGS area SGSA, and in the SGS area SGSA, a conductive layer 45 penetrates the semiconductor layer 31. Alternatively, as illustrated in FIG. 5B, two of the semiconductor layers 31 are commonly connected in the vicinity of the SGS area SGSA, and in the SGS area SGSA, the conductive layer 45 penetrates the semiconductor layer 31. In the memory cell area MCA and the SGS area SGSA of the memory cell array 18, the two semiconductor layers 31 are commonly connected in the vicinity of the SGS area SGSA, so that the area of the nonvolatile semiconductor storage device according to the present embodiment is reduced. The conductive layer 45 functions as the source line contact plug CSL. As in FIG. 3, in the examples of FIGS. 5A and 5B, the semiconductor layer 31 has a circular shape at the connection area with the conductive layer 45. The conductive layer 45 may be made of the same conductive material as that of the conductive layer 37 (the contact plug CBL of the bit line).

In the SGS area SGSA, similarly to the insulating layer 38, an insulating layer 46 surrounds the side surface of the semiconductor layer 31. The insulating layer 46 functions as the gate insulating film of the select transistor ST2. The insulating layer 46 may be made of the same insulating material as that of the insulating layer 38.

The insulating layer 46 is in contact with a conductive layer 47 at a side surface opposite to the side surface in contact with the semiconductor layer 31. The conductive layer 47 functions as the select gate line SGS. The conductive layer 47 includes a first portion that extends between the memory cell area MCA and the arc shape of the insulating layer 46, and a second portion that is connected to the first portion and has the arc shape along the arc shape of the insulating layer 46. The conductive layer 47 may be made of the same conductive material as that of the conductive layer 39 (the select gate lines SGD-1 to SGD-k).

In the SGS area SGSA, the area including the semiconductor layer 31 from the memory cell area MCA to the conductive layer 45, the insulating layer 46, and the first portion of the conductive layer 47 functions as the select transistor ST2. The second portion of the conductive layer 47 functions as the gate electrode of the select transistor ST2, and the insulating layer 46 functions as the gate insulating film of the select transistor ST2, such that the channel of the select transistor ST2 is formed in the semiconductor layer 31.

In the stepwise contact area SCSA, the conductive layer 49 is stacked in plurality in the X direction, and a conductive layer 49 and an insulating layer 44 penetrate the conductive layers 47. The conductive layer 49 functions as a contact plug CSGS. The conductive layer 49 is electrically connected to a corresponding one of the conductive layers 47 stacked in the Z direction. Similarly to the stepwise contact area SCDA that corresponds to the select gate line SGD, insulating layers 41, 42, 43 surround the conductive layer 49. The conductive layer 49 may be made of the same conductive material as that of the conductive layer 40 (contact plug CSGD).

<6. Circuit Configuration of Sense Amplifier Unit>

Figure 6:
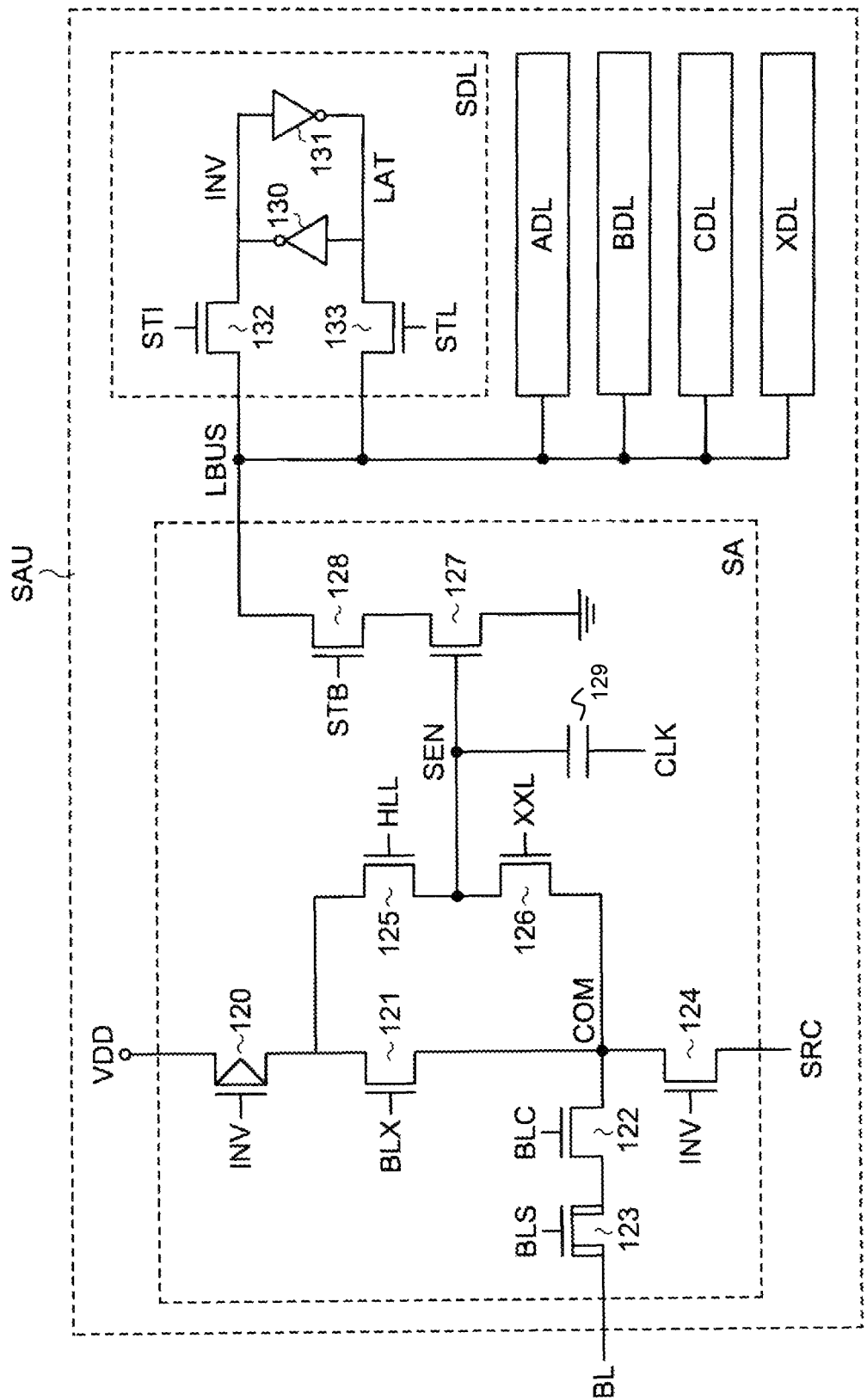
FIG. 6 is a circuit diagram illustrating an example of a circuit configuration of a sense amplifier unit according to the embodiment.

Next, an example of the circuit configuration of the sense amplifier unit SAU will be described. FIG. 6 is an example of the circuit configuration of the sense amplifier unit SAU. The circuit configuration of the sense amplifier unit SAU illustrated in FIG. 6 is given as an example, and the circuit configuration of the sense amplifier unit SAU of the nonvolatile semiconductor storage device according to the present embodiment is not limited to the example illustrated in FIG. 6. The descriptions of the same or similar configuration as that shown in FIGS. 1 to 5A and 5B may be omitted.

The sense amplifier module 20 includes a plurality of sense amplifier units SAU associated with bit lines BL1 to BLm (m is a natural number of 2 or more), respectively. FIG. 6 represents the circuit configuration of one of the sense amplifier units SAU.

The sense amplifier unit SAU may temporarily store, for example, data read onto a corresponding bit line BL. The sense amplifier unit SAU may perform a logical arithmetic operation using the temporarily stored data. Although details will be described later, the nonvolatile semiconductor storage device 1 may execute the read operation according to the present embodiment, by using the sense amplifier module 20 (the sense amplifier unit SAU).

As illustrated in FIG. 6, the sense amplifier unit SAU includes a sense amplifier section SA and latch circuits SDL, ADL, BDL, CDL, and XDL. The sense amplifier section SA and the latch circuits SDL, ADL, BDL, CDL, and XDL are connected to each other by a bus LBUS, so as to transmit/receive data with each other.

For example, during the read operation, the sense amplifier section SA senses the data read onto the corresponding bit line BL, and determines whether the read data is "0" or "1". The sense amplifier section SA includes, for example, a p-channel MOS transistor 120, re-channel MOS transistors 121 to 128, and a capacitor 129.

One end of the transistor 120 is connected to a power supply line, and the gate of the transistor 120 is connected to a node INV in the latch circuit SDL. One end of the transistor 121 is connected to the other end of the transistor 120, the other end of the transistor 121 is connected to a node COM, and a control signal BLX is input to the gate of the transistor 121. One end of the transistor 122 is connected to the node COM, and a control signal BLC is input to the gate of the transistor 122. The transistor 123 is a high breakdown voltage MOS transistor, one end of which is connected to the other end of the transistor 122, and the other end of which is connected to the corresponding bit line BL. A control signal BLS is input to the gate of the transistor 123.

One end of the transistor 124 is connected to the node COM, the other end of the transistor 124 is connected to a node SRC, and the gate of the transistor 124 is connected to the node INV. One end of the transistor 125 is connected to the other end of the transistor 120, the other end of the transistor 125 is connected to a node SEN, and a control signal HLL is input to the gate of the transistor 125. One end of the transistor 126 is connected to the node SEN, the other end of the transistor 126 is connected to the node COM, and a control signal XXL is input to the gate of the transistor 126.

One end of the transistor 127 is grounded, and the gate of the transistor 127 is connected to the node SEN. One end of the transistor 128 is connected to the other end of the transistor 127, the other end of the transistor 128 is connected to the bus LBUS, and a control signal STB is input to the gate of the transistor 128. One end of the capacitor 129 is connected to the node SEN, and a clock CLK is input to the other end of the capacitor 129.

The control signals BLX, BLC, BLS, HLL, XXL, and STB described above are generated by, for example, the sequencer 15. A voltage VDD which is, for example, an internal power supply voltage of the nonvolatile semiconductor storage device 1 is applied to the power supply line connected to one end of the transistor 120, and a voltage VSS which is, for example, a ground voltage of the nonvolatile semiconductor storage device 1 is applied to the node SRC.

The latch circuits SDL, ADL, BDL, CDL, and XDL temporarily store read data. The latch circuit XDL is connected to, for example, the data register 21 and is used for inputting/outputting data between the sense amplifier unit SAU and the input/output circuit 10.

The latch circuit SDL includes, for example, inverters 130 and 131 and n-channel MOS transistors 132 and 133. The input node of the inverter 130 is connected to a node LAT, and the output node of the inverter 130 is connected to the node INV. The input node of the inverter 131 is connected to the node INV, and the output node of the inverter 131 is connected to the node LAT. One end of the transistor 132 is connected to the node INV, the other end of the transistor 132 is connected to the bus LBUS, and a control signal STI is input to the gate of the transistor 132. One end of the transistor 133 is connected to the node LAT, the other end of the transistor 133 is connected to the bus LBUS, and a control signal STL is input to the gate of the transistor 133. For example, data stored in the node LAT corresponds to data stored in the latch circuit SDL, and data stored in the node INV corresponds to inverted data of the data stored in the node LAT. Since the circuit configurations of the latch circuits ADL, BDL, CDL, and XDL are the same as, for example, the circuit configuration of the latch circuit SDL, description thereof are omitted herein.

In the sense amplifier module 20 described above, the timing for determining data read onto the bit line BL by each sense amplifier unit SAU is based on a timing when the control signal STB is asserted. In the present descriptions and others, the description "the sequencer 15 asserts the control signal STB" indicates that the sequencer 15 changes the control signal STB from an "L" level to an "H" level.

The configuration of the sense amplifier module 20 according to the present embodiment is not limited to the configuration described above. For example, in the sense amplifier unit SAU, the transistor 128 with the gate thereof to which the control signal STB is input may be a p-channel MOS transistor. In this case, the description "the sequencer 15 asserts the control signal STB" indicates that the sequencer 15 changes the control signal STB from the "H" level to the "L" level.

The number of latch circuits in the sense amplifier unit SAU is not limited to any particular number. The number of latch circuits may be set based on, for example, the number of bits of data stored in one memory cell transistor MC. Further, a plurality of bit lines BL may be connected to one sense amplifier unit SAU via a selector.

<7. Threshold Voltage Distributions of Memory Cell Transistors>

Figure 7:
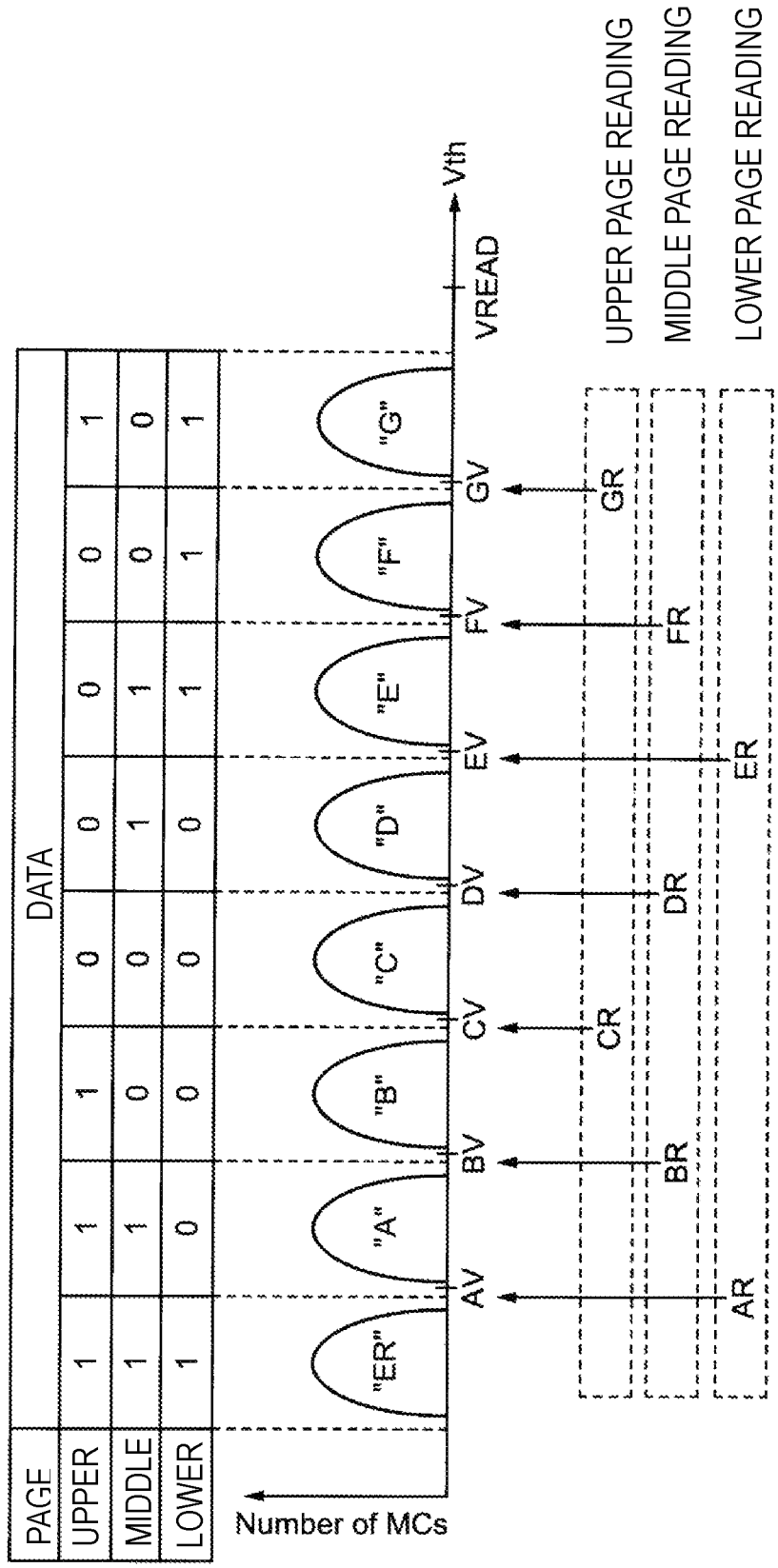
FIG. 7 is a diagram illustrating an example of threshold voltage distributions of memory cell transistors according to the embodiment.

Next, an example of the threshold voltage distributions of the memory cell transistors MC will be described. FIG. 7 is a threshold voltage distribution diagram illustrating an example of the threshold voltage distributions of the memory cell transistors MC. The threshold voltage distributions of the memory cell transistors MC illustrated in FIG. 7 are given as an example, and the threshold voltage distributions of the memory cell transistors MC of the nonvolatile semiconductor storage device according to the present embodiment are not limited to the example illustrated in FIG. 7. The descriptions of the same or similar configuration as that shown in FIGS. 1 to 6 may be omitted.

The nonvolatile semiconductor storage device 1 according to the present embodiment uses, for example, a triple-level cell (TLC) method that stores 3-bit data in one memory cell transistor MC, as a method of writing data in a memory cell transistor MC.

FIG. 7 illustrates examples of the threshold voltage distributions of the memory cell transistors MC, data allocations, a read voltage, and a verify voltage in the TLC method. In the threshold voltage distributions illustrated in FIG. 7, the vertical axis corresponds to the number of memory cell transistors MC, and the horizontal axis corresponds to a threshold voltage Vth of a memory cell transistor MC.

In the TLC method, the plurality of memory cell transistors MC form eight threshold voltage distributions as represented in FIG. 7. The eight threshold voltage distributions are referred to as an "ER" state, an "A" state, a "B" state, a "C" state, a "D" state, an "E" state, an "F" state, and a "G" state, in an ascending order of the threshold voltage. For example, different 3-bit data are allocated to the "ER" state, the "A" state, the "B" state, the "C" state, the "D" state, the "E" state, the "F" state, and the "G" state, respectively, as follows.

"ER" state: "111" ("lower bit/middle bit/upper bit") data
"A" state: "011" data
"B" state: "001" data
"C" state: "000" data
"D" state: "010" data
"E" state: "110" data "F" state: "100" data "G" state: "101" data A verify voltage used for each write operation is set between adjacent threshold voltage distributions. Specifically, verify voltages AV, BV, CV, DV, EV, FV, and GV are set in association with the "A" state, the "B" state, the "C" state, the "D" state, the "E" state, the "F" state, and the "G" state, respectively.

For example, the verify voltage AV is set between the maximum threshold voltage at the "ER" state and the minimum threshold voltage at the "A" state. When the verify voltage AV is applied to the memory cell transistors MC, the memory cell transistor MC having the threshold voltage in the "ER" state is turned on, and the memory cell transistors MC having the threshold voltages in the threshold voltage distributions equal to or higher than the "A" state are turned off.

The other verify voltages BV, CV, DV, EV, FV, and GV are also set in the similar manner to that for the verify voltage AV. The verify voltage BV is set between the "A" state and the "B" state, the verify voltage CV is set between the "B" state and the "C" state, and the verify voltage DV is between the "C" state and the "D" state, and the verify voltage EV is set between the "D" state and the "E" state, the verify voltage FV is set between the "E" state and the "F" state, and the verify voltage GV is set between the "F" state and the "G" state.

For example, the verify voltage AV may be set to 0.8 V, the verify voltage BV may be set to 1.6 V, the verify voltage CV may be set to 2.4 V, the verify voltage DV may be set to 3.1 V, the verify voltage EV may be set to 3.8 V, the verify voltage FV may be set to 4.6 V, and the verify voltage GV may be set to 5.6 V. However, the verify voltages AV, BV, CV, DV, EV, FV, and GV are not limited to the example described herein. The verify voltages AV, BV, CV, DV, EV, FV, and GV may be appropriately set in a stepwise manner, for example, in a range of 0 V to 7.0 V.

A read voltage used for each read operation may be set between adjacent threshold voltage distributions. For example, a read voltage AR for determining whether a threshold voltage of a memory cell transistor MC is in the "ER" state or the state equal to or higher than the "A" state is set between the maximum threshold voltage at the "ER" state and the minimum threshold voltage at the "A" state.

The other read voltages BR, CR, DR, ER, FR, and GR may be set in the similar manner to that for the read voltage AR. For example, the read voltage BR is set between the "A" state and the "B" state, the read voltage CR is set between the "B" state and the "C" state, the read voltage DR is set between the "C" state and the "D" state, the read voltage ER is set between the "D" state and the "E" state, the read voltage FR is set between the "E" state and the "F" state, and the read voltage GR is set between the "F" state and the "G" state.

Then, a read pass voltage VREAD is set to a voltage higher than the maximum threshold voltage of the highest threshold voltage distribution (e.g., the "G" state). The memory cell transistor MC having the gate to which the read pass voltage VREAD is applied is turned on, regardless of data to be stored.

The verify voltages AV, BV, CV, DV, EV, FV, and GV are set to be higher than, for example, the read voltages AR, BR, CR, DR, ER, FR, and GR, respectively. That is, the verify voltages AV, BV, CV, DV, EV, FV, and GV are set to be near the minimum threshold voltages of the threshold voltage distributions of the "A" state, the "B" state, the "C" state, the "D" state, the "E" state, the "F" state, and the "G" state, respectively.

For example, when the data allocations described above are applied, 1-page data of the lower bit (lower page data) is determined in the read operation by a result of the reading using the read voltages AR and ER. Further, 1-page data of the middle bit (middle page data) is determined by a result of the reading using the read voltages BR, DR, and FR. Further, 1-page data of the upper bit (upper page data) is determined by a result of the reading using the read voltages CR and GR. In this way, since the lower page data, the middle page data, and the upper page data are determined by two read operations, three read operations, and two read operations, respectively, the allocation of the data is described as "2-3-2 code".

In addition, the number of bits of data stored in one memory cell transistor MC described above and the data allocations to the threshold voltage distributions of the memory cell transistors MC are given as examples, and are not limited to the examples. For example, 2-bit or 4-bit or more data may be stored in one memory cell transistor MC. The read voltage and the read pass voltage may be set to the same voltage value or different voltage values in each method.

<8. Outline of Write Operation and Read Operation>

An operation method of the memory cell array illustrated in FIG. 2 will be described. When the number of the semiconductor layers 31 is "k", a "k" number of memory groups MG stacked in the Z direction are in the area separated by the memory trenches MT (each of the memory configurations MR1 to MR4).

As a specific example, descriptions will be made on a case where the number of the semiconductor layers 31 "k" is 12. In this case, 12 layers of the memory groups MG are stacked. 12 select gate lines SGD correspond to the 12 layers of memory groups MG, respectively.

The string units SU make up one block BLK. The write operation, the read operation, and the erase operation are executed in units of the block BLK.

For example, the nonvolatile semiconductor storage device 1 according to the present embodiment repeatedly executes a program loop during the write operation. The program loop includes a program operation and a verify operation. The program operation injects electrons into the charge storage layer of a selected memory cell transistor MC, so as to increase the threshold voltage of the selected memory cell transistor MC. Alternatively, the program operation inhibits the injection of electrons into the charge storage layer, so as to maintain the threshold voltage of the selected memory cell transistor MC. Subsequent to the program operation, the verify operation executes a reading using the verify voltage, so as to verify whether the threshold voltage of the selected memory cell transistor MC has reached a target level. The selected memory cell transistor MC of which threshold voltage has reached the target level enters into a write-inhibited state.

In the nonvolatile semiconductor storage device 1 according to the present embodiment, the program loop that includes the program operation and the verify operation as described above is repeated, so that the threshold voltage of the selected memory cell transistor MC increases to the target level.

The electrons stored in the charge storage layer may be in an unstable state. Thus, the electrons stored in the charge storage layer of the memory cell transistor MC may escape from the charge storage layer with the lapse of time from the timing when the above-described program operation is completed. When the electrons escape from the charge storage layer, the threshold voltage of the memory cell transistor MC decreases. Thus, during the read operation executed after the write operation is completed, the read operation is executed using the read voltage lower than the verify voltage, in order to account for the decrease of the threshold voltage of the memory cell transistor which may occur over time. In the present descriptions and others, each operation of the nonvolatile semiconductor storage device 1 is described as a part of an operation method. The write operation of the nonvolatile semiconductor storage device 1 is part of a write operation method, the read operation of the nonvolatile semiconductor storage device 1 is part of a read operation method, the erase operation of the nonvolatile semiconductor storage device 1 is part of an erase operation method, and the verify operation of the nonvolatile semiconductor storage device 1 is part of a verify operation method.

<9. Example of Read Operation>
<9-1. Comparison between Present Embodiment and Example of Related Art>

Figure 8:
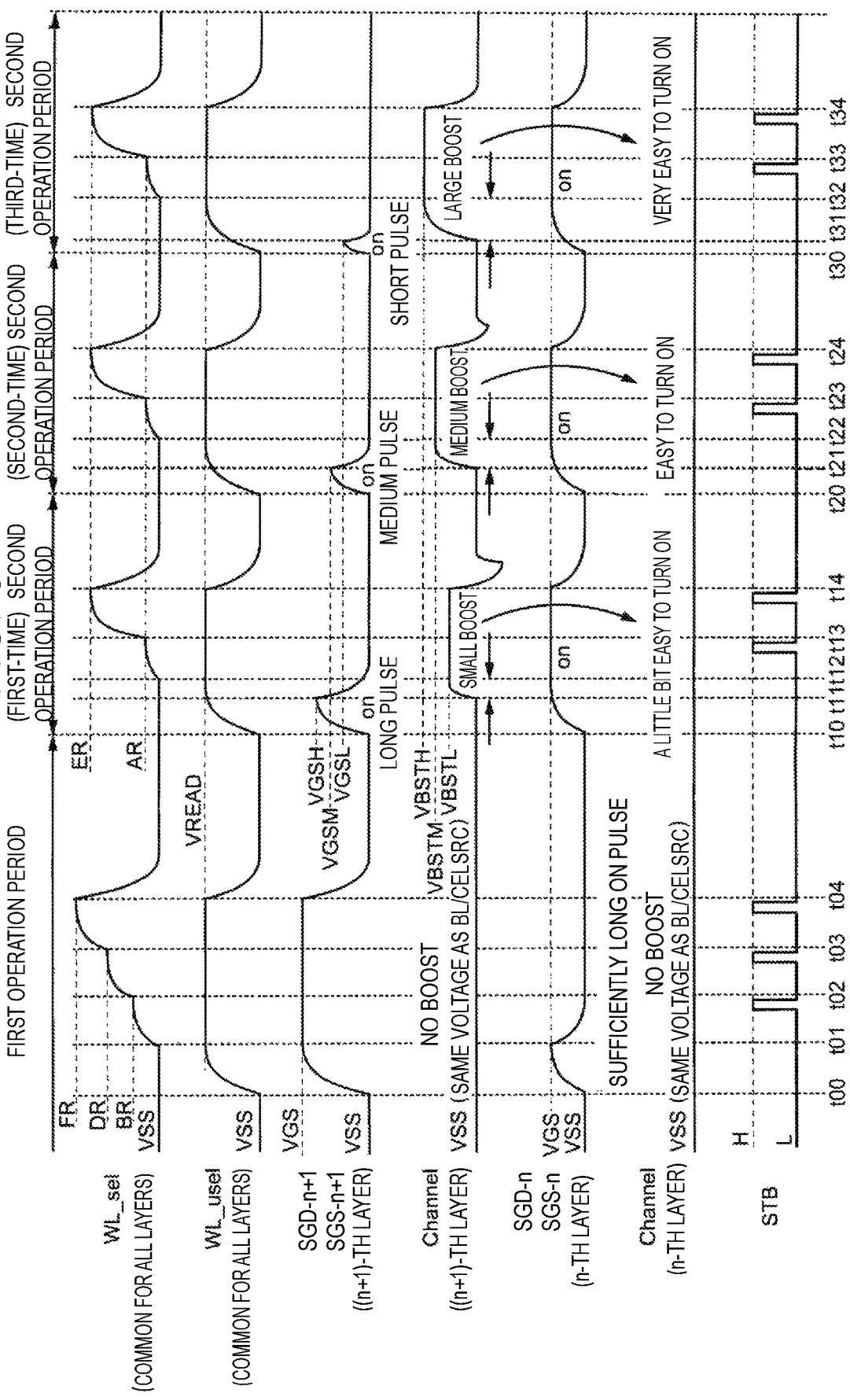
FIG. 8 is a timing chart illustrating a read operation in the nonvolatile semiconductor storage device according to the embodiment.

FIG. 8 is a timing chart illustrating an example of voltages applied to various circuit components used during the read operation in the nonvolatile semiconductor storage device 1 according to the present embodiment. The timing chart illustrated in FIG. 8 is a schematic timing chart representing the voltages applied to the various circuit components, and does not illustrate, for example, the voltages supplied to the word lines and the voltage variations of the select gate lines SGD and SGS. The timing chart illustrated in FIG. 8 is an example of a timing chart that represents an example of the read operation, and the timing chart of the nonvolatile semiconductor storage device according to the present embodiment is not limited to the example illustrated in FIG. 8. The descriptions of the same or similar configuration as that shown in FIGS. 1 to 7 may be omitted.

In the following descriptions, a word line connected to a memory cell transistor MC selected from each memory string MSa or MSb will be referred to as a selected word line WL_sel, and word lines connected to the other memory cell transistors MC will be referred to as non-selected word lines WL_usel. Each of the word lines including the selected word line WL_sel and the non-selected word line WL_usel is commonly connected to all of the semiconductor layers 31. The following description is made by focusing on the n-th semiconductor layer 31 in which the selected memory cell transistor MC is formed, and the (n+1)-th semiconductor layer 31 adjacent to the n-th semiconductor layer 31. Each of the semiconductor layers 31 will be referred also to as a channel layer. The n-th select gate lines SGD and SGS are referred also to as the select gate lines SGD-n and SGS-n, and the (n+1)-the select gate lines SGD and SGS are referred also to as the select gate lines SGD-n+1 and SGS-n+1. While the voltages illustrated in FIG. 8 are supplied to the select gate lines SGD and SGS, the voltages illustrated in FIG. 8 may be supplied to one of the select gate lines SGD and SGS. Further, the source line SL will be expressed in other words as a source line CELSRC. When the selected memory cell transistor MC belongs to one of the memory strings MSa and MSb (e.g., MSa), for example, a ground voltage VSS is applied to the word line connected to the memory cell transistor MC that belongs to the other one of the memory strings MSa and MSb (e.g., MSb), in order not to form a current path parallel to the memory string to which the selected memory cell transistor MC belongs.

In the read operation of the nonvolatile semiconductor storage device 1 according to the present embodiment, when the sequencer 15 executes a reading on the memory cell transistor MC in the n-th channel layer, the sequencer 15 executes a first operation to turn on the select transistor ST1-$n$+1 and the select transistor ST2-$n$+1 in the (n+1)-th layer, and simultaneously, supply three different read voltages (read voltages BR, DR, and FR) to the selected word line WL-sel in a state where the select transistor ST1-$n$ and the select transistor ST2-$n$ are turned off, so as to read the data stored in the memory cell transistor MC of the (n+1)-th layer selected by the selected word line WL-sel.

Further, in the read operation of the nonvolatile semiconductor storage device 1 according to the present embodiment, after the first operation, the sequencer 15 executes a second operation to supply two different read voltages (read voltages AR and ER) to the selected word line WL-sel in a state where at least the select transistor ST1-$n$ and the select transistor ST2-$n$ in the n-th layer are turned on, so as to read the data stored in the memory cell transistor MC of the n-th layer selected by the selected word line WL-sel. Here, the second operation is repeated an "x" number of times ("x" is a natural number of 2 or more).

In the nonvolatile semiconductor storage device 1 according to the present embodiment, the data (represented by the threshold voltage) of the memory cell transistor MC in the n-th channel layer is determined using the read results acquired from the reading executed multiple times on the memory cell transistor MC in the n-th channel layer, and a plurality of data read from the memory cell transistor MC of the (n+1)-th layer. Here, for example, the read results acquired from the reading executed multiple times on the memory cell transistor MC in the n-th channel layer, and the plurality of data read from the memory cell transistor MC of the (n+1)-th channel layer are temporarily stored in the latch circuits SDL, ADL, BDL, CDL and others in the sense amplifier unit SAU. For example, the data of the memory cell transistor MC in the n-th channel layer is calculated by performing a logic arithmetic operation in the sense amplifier unit SAU using the read results acquired from the reading executed multiple times on the memory cell transistor MC in the n-th channel layer, and the plurality of data read from the memory cell transistor MC of the (n+1)-th channel layer, which are stored in the latch circuits SDL, ADL, BDL, CDL and others. As described above, the nonvolatile semiconductor storage device 1 may execute the read operation according to the present embodiment by the sequencer 15, using the sense amplifier module 20 (the sense amplifier unit SAU).

In the present descriptions and others, the voltage supplied to the selected word line WL-sel during the first operation in the read operation may be referred to as a first voltage. In the present embodiment, the first voltage includes three different read voltages. However, the first voltage is not limited to the example illustrated in FIG. 8. For example, the first voltage may be two different read voltages, or may be the read voltages AR and BR. Further, in the present descriptions and others, the voltage supplied to the selected word line WL-sel during the second operation in the read operation may be referred to as a second voltage. In the present embodiment, the second voltage includes two different read voltages. However, the second voltage is not limited to the example illustrated in FIG. 8. For example, based on the coding illustrated in FIG. 7, instead of the combination of read voltages AR and ER (for lower page), the combination of read voltages CR and GR (for upper page) or the combination of read voltages BR, DR and FR (for middle page) may be used. Further, depending on the coding, another combination of read voltages may be using.

Here, the read operation of a comparative example will be described. In the three-dimensional NAND type flash memory in which the memory strings extend in the horizontal direction, for example, only the insulating layer 51 is formed between the n-th channel layer (the semiconductor layer 31) and the (n+1)-th channel layer (the semiconductor layer 31), as illustrated in FIG. 2 or 4. Accordingly, for example, a capacitive coupling exists between the FG of the memory cell transistor MCa0 in the n-th channel layer and the FG of the memory cell transistor MCa0 in the (n+1)-th channel layer, between the FG of the memory cell transistor MCa0 in the n-th channel layer and the channel of the memory cell transistor MCa0 in the (n+1)-th channel layer, and between the channel of the memory cell transistor MCa0 in the n-th channel layer and the channel of the memory cell transistor MCa0 in the (n+1)-th channel layer. As a result, in the three-dimensional NAND type flash memory in which the memory strings extend in the horizontal direction, the interference is large between the memory cell transistor of the n-th channel layer and the memory cell transistor of the (n+1)-th channel layer. That is, the interference between the memory cell transistors adjacent to each other in the Z direction is large.

For example, when data is written to the memory cell transistor MCa0 in the n-th channel layer (such that electrons are injected), and then, data is written to the memory cell transistor MCa0 in the (n+1)-th channel layer (such that electrons are injected), the memory cell transistor MCa0 in the n-th channel layer and the memory cell transistor MCa0 in the (n+1)-th channel layer interfere with each other via the capacitive coupling. As a result, when the data written to the memory cell transistor MCa0 in the n-th channel layer is read after data is written to the memory cell transistor MCa0 in the (n+1)-th channel layer, the effective threshold value of the memory cell transistor MCa0 in the n-th channel layer may vary, and a reading error may occur.

Meanwhile, in the read operation of the nonvolatile semiconductor storage device 1 according to the present embodiment, when a reading is executed on the memory cell transistor MC in the n-th channel layer and connected to the selected word line WL-sel, the data stored in the memory cell transistor MC in the (n+1)-th channel layer and connected to the same selected word line WL-sel is read first. At this time, a plurality of read voltages is supplied to the selected word line WL-sel. As a result, the data stored in the memory cell transistor MC of the (n+1)-th channel layer may be read in association with the plurality of read voltages, respectively. Further, in the read operation of the nonvolatile semiconductor storage device 1 according to the present embodiment, after the data stored in the memory cell transistor MC in the (n+1)-th layer channel layer is read, a reading is executed multiple times on the memory cell transistor MC in the n-th layer channel layer, using the plurality of data read from the memory cell transistor MC of the (n+1)-th channel layer. In the nonvolatile semiconductor storage device 1 according to the present embodiment, the data of the memory cell transistor MC in the n-th channel layer may be determined, using the read results acquired from the reading executed multiple times on the memory cell transistor MC in the n-th channel layer, and the plurality of data read from the memory cell transistor MC of the (n+1)-th channel layer.

Accordingly, in the read operation of the nonvolatile semiconductor storage device 1 according to the present embodiment, the read voltage of the memory cell transistor in the n-th channel layer may be selected, based on the read result obtained by applying the read voltages to the memory cell transistor in the (n+1)-th layer channel layer. Accordingly, by using the read operation of the nonvolatile semiconductor storage device 1 according to the present embodiment, the interference between adjacent memory cell transistors may be accurately corrected, so that a reading error is prevented.

Further, the first and second voltages are not limited and may be suitably selected.

<9-2. Example of First Operation>

Descriptions will be continued referring back to FIG. 8. The sequencer 15 (see FIG. 1) executes the application of voltages to the selected word line WL_sel, the non-selected word line WL_usel, the select gate lines SGD-n and SGS-n, the select gate lines SGD-n+1 and SGS-n+1, the bit line BL, and the source line CELSRC, by controlling, for example, the voltage generation circuit 17 (FIG. 1), the column decoder 22 (FIG. 1), the row decoder 19 (FIG. 1), and the sense amplifier module 20 (FIG. 1). Further, the sequencer 15 controls the control signal STB.

When the read operation is started, each of the voltages applied to the selected word line WL_sel, the non-selected word line WL_usel, the select gate lines SGD-n and SGS-n, the select gate lines SGD-n+1 and SGS-n+1, the bit line BL, the source line CELSRC, the n-th channel layer, and the (n+1)-the channel layer is the voltage VSS. Further, the voltage of the control signal STB is at a low (L) level. The low level may be the voltage VSS.

The sequencer 15 then executes the first operation. The period during which the first operation is executed is referred to as a first operation period. During the first operation period, the sequencer 15 executes the reading of the data stored in the memory cell transistor MC in the (n+1)-th channel layer and connected to the same selected word line WL-sel. For example, during the first operation, the sequencer 15 does not supply the first voltage to the selected word line WL-sel in a state where the select transistor ST1-$n$ and the select transistor ST2-$n$ in the n-th channel layer are turned on, but supplies the first voltage to the selected word line WL-sel in a state where the select transistor ST1-$n$ and the select transistor ST2-$n$ in the n-th channel layer are turned off. Hereinafter, an example of the first operation of the nonvolatile semiconductor storage device 1 according to the present embodiment will be described in detail.

The voltage or the like applied to each signal line from the timing t00 to the timing t01 of the first operation period will be described. The voltage VSS is applied to the selected word line WL_sel. A voltage VGS is applied to the select gate lines SGD-n and SGS-n. The voltage VGS is a voltage that turns on, for example, the select transistors ST1-$n$+1 and ST1-$n$+1 and the select transistors ST2-$n$+2 and ST2-$n$+2. At this time, the pulse width of the voltage VGS applied to the select gate lines SGD-n and SGS-n is long enough to turn on the select transistor ST1-$n$ and the select transistor ST2-$n$. The low level is applied to the control signal STB. Further, during the timing t00 to the timing t04 of the first operation period, the read pass voltage VREAD is applied to the non-selected word line WL_usel, the voltage VGS is applied to the select gate lines SGD-n+1 and SGS-n+1, and the voltage VSS is applied to the (n+1)-th channel layer and the n-th channel layer. When the voltage VSS is applied to the (n+1)-th channel layer and the n-th channel layer, the (n+1)-th channel layer and the n-th channel layer are not boosted. Here, the bit line BL and the source line CELSRC have the same voltage as the voltage VSS.

The voltage or the like applied to each signal line from the timing t01 to the timing t02 of the first operation period will be described. The read voltage BR is applied to the selected word line WL_sel. A high (H) level is applied to the control signal STB, shifting from the low level. When the control signal STB shifts from the low level to the high level, the control signal STB is asserted. As a result, the read data acquired by reading the memory cell transistor MC of the (n+1)-th channel layer based on a read voltage BR is transferred to the latch circuits (the latch circuits ADL, BDL, and CDL) in the sense amplifier module 20. Further, during the timing t02 to the timing t04 of the first operation period, the voltage VSS is applied to the select gate lines SGD-n and SGS-n, shifting from the voltage VGS. At this time, the select transistor ST1-$n$ and the select transistor ST2-$n$ enter into an OFF state.

The voltage or the like applied to each signal line from the timing t02 to the timing t03 of the first operation period will be described. The read voltage DR is applied to the selected word line WL_sel. The high level is applied to the control signal STB, shifting from the low level. When the control signal STB shifts from the low level to the high level, the control signal STB is asserted. As a result, the read data acquired by reading the memory cell transistor MC of the (n+1)-th channel layer based on a read voltage DR is transferred to the latch circuits (the latch circuits ADL, BDL, and CDL) in the sense amplifier module 20.

The voltage or the like applied to each signal line from the timing t03 to the timing t04 of the first operation period will be described. The read voltage FR is applied to the selected word line WL_sel. The high level is applied to the control signal STB, shifting from the low level. When the control signal STB shifts from the low level to the high level, the control signal STB is asserted. As a result, the read data acquired by reading the memory cell transistor MC of the (n+1)-th channel layer based on a read voltage FR is transferred to the latch circuits (the latch circuits ADL, BDL, and CDL) in the sense amplifier module 20.

During the timing t04 to the timing t10 of the first operation period, the voltage VSS is applied to each of the selected word line WL_sel, the non-selected word line WL_usel, the select gate lines SGD-n and SGS-n, the select gate lines SGD-n+1 and SGS-n+1, the bit line BL, the source line CELSRC, the n-th channel layer, and the (n+1)-th channel layer. Further, the low level is applied to the control signal STB, shifting from the high level. When the control signal STB shifts from the high level to the low level, the control signal STB is deasserted.

Descriptions have been made on an example where the sequencer 15 supplies the three different read voltages (the read voltages BR, DR, and FR) to the selected word line WL-sel during the first operation. However, the voltages supplied by the sequencer 15 to the selected word line WL-sel are not limited to the example given in FIG. 8. The voltages supplied by the sequencer 15 to the selected word line WL-sel may be, for example, the read voltages CR, DR, and FR, the two different read voltages CR and FR, or the two different read voltages BR and ER. When the sequencer 15 supplies relatively more read voltages to the selected word line WL-sel, the interference between adjacent memory cell transistors may be accurately corrected, so that the correction accuracy of the threshold of the selected memory cell transistor MC in the n-th channel layer is improved. In the present descriptions and others, the expression "applying a voltage" may be changed to "supplying a voltage".

<9-3. Example of Second Operation>

During the read operation of the nonvolatile semiconductor storage device 1 according to the present embodiment, the second operation is repeated an "x" number of times. Here, a case where the second operation is repeated three times (x=3) will be described as an example.

Like the first operation, the second operation is executed by the sequencer 15. During the second operation, the sequencer 15 executes a reading of the data stored in the memory cell transistor MC in the n-th channel layer and connected to the same selected word line WL-sel.

For example, during the second operation, the sequencer 15 supplies a voltage to the select transistor ST1-$n$+1 and the select transistor ST2-$n$+1 in a state where the select transistor ST1-$n$ and the select transistor ST2-$n$ in the n-th channel layer are turned on, supplies the voltage VGS to the select transistor ST1-$n$+1 and the select transistor ST2-$n$+1, and then, turns off the select transistor ST1-$n$+1 and the select transistor ST2-$n$+1. For example, the pulse width when the voltage VGS is supplied to the select transistor ST1-$n$+1 and the select transistor ST2-$n$+1 in the first-time second operation is different from the pulse width when the voltage VGS is supplied to the select transistor ST1-$n$+1 and the select transistor ST2-$n$+1 in the second-time second operation. In the first-time second operation, the voltage supplied to the select transistor ST1-$n$+1 and the select transistor ST2-$n$+1 increases to a voltage VGSH, according to the pulse width when the voltage VGS is supplied to the select transistor ST1-$n$+1 and the select transistor ST2-$n$+1. In the second-time second operation, the voltage supplied to the select transistor ST1-$n$+1 and the select transistor ST2-$n$+1 increases to a voltage VGSM, according to the pulse width when the voltage VGS is supplied to the select transistor ST1-$n$+1 and the select transistor ST2-$n$+1. The voltage VGSH is different from the voltage VGSM. More specifically, the pulse width when the voltage VGS is supplied in the first-time second operation is longer than the pulse width when the voltage VGS is supplied in the second-time second operation. The voltage VGSH is higher than the voltage VGSM. In the present descriptions and others, the voltage VGS is also referred to as a third voltage.

Further, for example, the pulse width when the voltage VGS is supplied to the select transistor ST1-$n$+1 and the select transistor ST2-$n$+1 in the second-time second operation is different from the pulse width when the voltage VGS is supplied to the select transistor ST1-$n$+1 and the select transistor ST2-$n$+1 in the third-time second operation. In the second-time second operation, the voltage supplied to the select transistor ST1-$n$+1 and the select transistor ST2-$n$+1 increases to the voltage VGSM, according to the pulse width when the voltage VGS is supplied to the select transistor ST1-$n$+1 and the select transistor ST2-$n$+1. In the third-time second operation, the voltage supplied to the select transistor ST1-$n$+1 and the select transistor ST2-$n$+1 increases to a voltage VGSL, according to the pulse width when the voltage VGS is supplied to the select transistor ST1-$n$+1 and the select transistor ST2-$n$+1. The voltage VGSM is different from the voltage VGSL. More specifically, the pulse width when the voltage VGS is supplied in the second-time second operation is longer than the pulse width when the voltage VGS is supplied in the third-time second operation. The voltage VGSM is higher than the voltage VGSL.

Further, in the second operation, when the sequencer 15 supplies the voltage that turns off the select transistor ST1-$n$+1 and the select transistor ST2-$n$+1, the voltage of the (n+1)-th channel layer becomes the voltage that boosts the (n+1)-th channel layer, and the voltage of the n-th channel layer becomes the voltage that does not boost the n-th channel layer. More specifically, in the first-time second operation, the voltage of the (n+1)-th channel layer becomes the voltage VBSTL that boosts the (n+1)-th channel layer, and simultaneously, the voltage of the n-th channel layer becomes the voltage that does not boost the n-th channel layer. In the second-time second operation, the voltage of the (n+1)-th channel layer becomes the voltage VBSTM that boosts the (n+1)-th channel layer, and simultaneously, the voltage of the n-th channel layer becomes the voltage that does not boost the n-th channel layer. Here, the boost voltage VBSTL is different from the boost voltage VBSTM. More specifically, the boost voltage VBSTL is lower than the boost voltage VBSTM. In the present descriptions and others, the boost voltage VBSTL is also referred to as a first boost voltage, and the boost voltage VBSTM is also referred to as a second boost voltage.

Further, in the third-time second operation, the voltage of the (n+1)-th channel layer becomes the voltage VBSTH that boosts the (n+1)-th channel layer, and simultaneously, the voltage of the n-th channel layer becomes the voltage that does not boost the n-th channel layer. Here, the boost voltage VBSTH is different from the boost voltages VBSTL and VBSTM. More specifically, the boost voltage VBSTH is higher than the boost voltages VBSTL and VBSTM. In the present descriptions and others, the boost voltage VBSTM is also referred to as a first boost voltage, the boost voltage VBSTH is also referred to as a second boost voltage, and the boost voltage VBSTL is also referred to as a third boost voltage.

Hereinafter, an example of the second operation of the nonvolatile semiconductor storage device 1 according to the present embodiment will be described in detail. First, the first-time second operation will be described. The voltage or the like applied to each signal line from the timing t10 to the timing t11 of the first-time second operation period will be described. The voltage VSS is applied to the selected word line WL_sel. The read pass voltage VREAD is applied to the non-selected word line WL_usel. The voltage applied to the select gate lines SGD-n+1 and SGS-n+1 increases to the voltage VGSH according to the pulse width when the voltage VGS is supplied. The voltage VGSH is lower than, for example, the voltage VGS and is a voltage that turns on the select transistors ST1-$n$+1 and ST2-$n$+1. The pulse width of the voltage VGS applied to the select gate lines SGD-n+1 and SGS-n+1 is shorter than the pulse width of the voltage VGS applied to the select gate lines SGD-n and SGS-n. Further, the voltage VSS is applied to the (n+1)-th channel layer and the n-th channel layer. When the voltage VSS is applied to the (n+1)-th channel layer and the n-th channel layer, the (n+1)-th channel layer and the n-th channel layer are not boosted. Further, the voltage VGS is applied to the select gate lines SGD-n and SGS-n. The voltage VGS is a voltage that turns on the select transistors ST1-$n$ and ST2-$n$. The low level is applied to the control signal STB.

The voltage or the like applied to each signal line from the timing t11 to the timing t12 of the first-time second operation period will be described. The voltage VSS is applied to the selected word line WL_sel. The read pass voltage VREAD is applied to the non-selected word line WL_usel. The voltage applied to the select gate lines SGD-n+1 and SGS-n+1 changes from the voltage VGSH to the voltage VSS according to the pulse width when the voltage VGS is supplied. The voltage of the (n+1)-th channel layer becomes the boost voltage VBSTL. When the voltage of the (n+1)-th layer channel layer becomes the boost voltage VBSTL, the (n+1)-th layer channel layer is boosted. The voltage VGS is applied to the select gate lines SGD-n and SGS-n, and the select transistors ST1-$n$ and ST2-$n$ enter into the ON state. The voltage VSS is applied to the (n+1)-th layer channel layer, and the n-th channel layer is not boosted. The low level is applied to the control signal STB.

In the present descriptions and others, the boost voltage refers to a voltage increased by the coupling between the word line WL or the non-selected word line WL_usel and a channel. Further, in the present descriptions and others, the period until the voltage is applied to the non-selected word line WL_usel after the voltage applied to the select gate lines SGD and SGS starts to decrease will be referred to as a boost period. The period until the voltage is applied to the non-selected word line WL_usel after the voltage applied to the select gate lines SGD and SGS starts to decrease may be a period until the voltage of the non-selected word line WL_usel increases after the voltage supply to the select gate lines SGD and SGS is shut off, a period during which the voltage VBSTL is applied to the (n+1)-th layer channel layer, and a period during which the select transistors ST1-$n$+1 and ST2-$n$+1 shift from the ON state to the OFF state. In the first-time second operation period, the period from the timing t11 to the timing t12 is the boost period.

The voltage or the like applied to each signal line from the timing t12 to the timing t13 of the first-time second operation period will be described. The read voltage AR is applied to the selected word line WL_sel. The read pass voltage VREAD is applied to the non-selected word line WL_usel. The voltage VSS is applied to the select gate lines SGD-n+1 and SGS-n+1, and the select transistors ST1-$n$+1 and ST2-$n$+1 enter into the OFF state. Since the voltage of the (n+1)-th layer channel layer has become the boost voltage VBSTL, the (n+1)-th layer channel layer is maintained in the boosted state. The voltage VGS is applied to the select gate lines SGD-n and SGS-n, and the select transistors ST1-$n$ and ST2-$n$ are maintained in the ON state. The voltage VSS is applied to the n-th channel layer, and the n-th channel layer is not boosted. When the high level is applied to the control signal STB, shifting from the low level, and the control signal STB is asserted, read data read from the memory cell transistor MC of the n-th channel layer based on a read voltage AR is transferred to the latch circuits (latch circuits ADL, BDL, and CDL) in the sense amplifier module 20.

During the timing t13 to the timing t14 of the first-time second operation period, the read voltage ER is applied to the select word line WL_sel. Further, when the high level is applied to the control signal STB, shifting from the low level, and the control signal STB is asserted, read data read from the memory cell transistor MC of the n-th channel layer based on a read voltage ER is transferred to the latch circuits (latch circuits ADL, BDL, and CDL) in the sense amplifier module 20. Since the voltages or the like applied to the signal lines or the like other than the selected word line WL_sel and the control signal STB from the timing t13 to the timing t14 of the first-time second operation period are the same as the voltages or the like applied from the timing t12 to the timing t13 of the first-time second operation period as described above, descriptions thereof are omitted herein.

During the timing t14 to the timing t20 of the first-time second operation period, the voltage VSS is applied to each of the selected word line WL_sel, the non-selected word line WL_usel, the select gate lines SGD-n and SGS-n, the select gate lines SGD-n+1 and SGS-n+1, the bit line BL, the source line CELSRC, the n-th channel layer, and the (n+1)-th layer channel layer. Further, the low level is applied to the voltage of the control signal STB, shifting from the high level. When the control signal STB shifts from the high level to the low level, the control signal STB is deasserted.

In the read operation of the related art, a voltage that sufficiently turns on the select transistors ST1-$n$+1 and ST2-n+1 is applied to the select gate line SGD-n+1. Further, the voltage VSS is applied to the (n+1)-th layer channel layer, and the (n+1)-th layer channel layer is not boosted. Meanwhile, in the second operation of the nonvolatile semiconductor storage device 1 according to the present embodiment, a voltage is applied in a pulse form to the select gate lines SGD-n+1 and SGS-n+1 such that the select transistors ST1-n+1 and ST2-n+1 shift from the ON state to the OFF state, and the voltage of the (n+1)-th layer channel layer becomes the boost voltage. Simultaneously, the voltage VGS is applied to the select gate lines SGD-n and SGS-n such that the select transistors ST1-n and ST2-n enter into the ON state, and the n-th channel layer is not boosted so that the selected memory cell transistor MC in the n-th channel layer may be easily turned on.

Next, the second-time second operation will be described. The voltage or the like applied to each signal line from the timing t20 to the timing t21 of the second-time second operation period will be described. The voltage VSS is applied to the selected word line WL_sel. The read pass voltage VREAD is applied to the non-selected word line WL_usel. The voltage applied to the select gate lines SGD-n+1 and SGS-n+1 increases to the voltage VGSM according to the pulse width when the voltage VGS is supplied. The voltage VGSM is lower than, for example, the voltages VGS and VGSH, and is a voltage that turns on the select transistors ST1-n+1 and ST2-n+1. The pulse width of the voltage VGS applied to the select gate lines SGD-n+1 and SGS-n+1 from the timing t20 to the timing t21 of the second-time second operation period is shorter than the pulse width of the voltage VGS applied to the select gate lines SGD-n+1 and SGS-n+1 and the pulse width of the voltage VGS applied to the select gate lines SGD-n and SGS-n from the timing t10 to the timing t11 of the first-time second operation period. Further, the voltage VSS is applied to the (n+1)-th channel layer and the n-th channel layer, and the (n+1)-th channel layer and the n-th channel layer are not boosted. Further, the voltage VGS is applied to the select gate lines SGD-n and SGS-n, and the low level is applied to the control signal STB.

The voltage or the like applied to each signal line from the timing t21 to the timing t22 of the second-time second operation period will be described. The voltage VSS is applied to the selected word line WL_sel. The read pass voltage VREAD is applied to the non-selected word line WL_usel. The voltage applied to the select gate lines SGD-n+1 and SGS-n+1 increases from the voltage VGSM to the voltage VSS according to the pulse width when the voltage VGS is supplied. The voltage VGSM is lower than the voltage VGSH. The voltage of the (n+1)-th channel layer becomes the boost voltage VBSTM. The boost voltage VBSTM is higher than the boost voltage VBSTL. When the voltage of the (n+1)-th channel layer becomes the voltage VBSTM, the (n+1)-th channel layer is boosted. During the timing t21 to the timing t22 of the second-time second operation period as well, the voltage VGS is applied to the select gate lines SGD-n and SGS-n such that the select transistors ST1-n and ST2-n are turned on, the voltage VSS is applied to the n-th channel layer such that the n-th channel layer is not boosted, and the low level is applied to the control signal STB, as in the period from the timing t20 to the timing t21 of the first-time second operation period. In the second-time second operation period, the period from the timing t21 to the timing t22 is the boost period.

During the timing t22 to the timing t24 of the second-time second operation period, since the voltage of the (n+1)-th channel layer has become the boost voltage VBSTM, the (n+1)-th channel layer is maintained in the boosted state. Further, during the timing t22 to the timing t23 of the second-time second operation period, the high level is applied to the control signal STB, shifting from the low level, such that the control signal STB is asserted, and read data read from the memory cell transistor MC of the n-th channel layer based on a read voltage AR is transferred to the latch circuits (latch circuits ADL, BDL, and CDL) in the sense amplifier module 20. Further, during the timing t23 to the timing t24 of the second-time second operation period, the high level is applied to the control signal STB, shifting from the low level, such that the control signal STB is asserted, and read data read from the memory cell transistor MC of the n-th channel layer based on a read voltage ER is transferred to the latch circuits (latch circuits ADL, BDL, and CDL) in the sense amplifier module 20. Since the voltages or the like applied to the signal lines or the like other than the (n+1)-th channel layer and the control signal STB from the timing t22 to the timing t30 of the second-time second operation period are the same as the voltages or the like applied from the timing t12 to the timing t20 of the first-time second operation period as described above, descriptions thereof are omitted herein.

In the second-time second operation period, the time during which the voltage is applied to the select gate lines SGD-n+1 and SGS-n+1 is shorter than that in the first-time second operation period. As a result, since the boost period in the second-time second operation period may be longer than that in the first-time second operation period, the boost voltage in the second-time second operation period may be made higher than that in the first-time second operation period. Thus, the selected memory cell transistor MC in the n-th channel layer may be easily turned on.

Subsequently, the third-time second operation will be described. The voltage or the like applied to each signal line from the timing t30 to the timing t31 of the third-time second operation period will be described. The voltage VSS is applied to the selected word line WL_sel. The read pass voltage VREAD is applied to the non-selected word line WL_usel. The voltage applied to the select gate lines SGD n+1 and SGS-n+1 increases to the voltage VGSL according to the pulse width when the voltage VGS is supplied. The voltage VGSL is lower than, for example, the voltage VGSM and is a voltage that turns on the select transistors ST1-n+1 and ST2-n+1. The pulse width of the voltage VGS applied to the select gate lines SGD-n+1 and SGS-n+1 is shorter than the pulse width of the voltage VGS applied to the select gate lines SGD-n+1 and SGS-n+1 and the pulse width of the voltage VGS applied to the select gate lines SGD-n and SGS-n from the timing t20 to the timing t21 of the second-time second operation period. Further, the voltage VSS is applied to the (n+1)-th channel layer and the n-th channel layer, and the (n+1)-th channel layer and the n-th channel layer are not boosted. Further, the voltage VGS is applied to the select gate lines SGD-n and SGS-n, and the low level is applied to the control signal STB.

The voltage or the like applied to each signal line from the timing t31 to the timing t32 of the third-time second operation period will be described. The voltage VSS is applied to the selected word line WL_sel. The read pass voltage VREAD is applied to the non-selected word line WL_usel. The voltage applied to the select gate lines SGD-n+1 and SGS-n+1 changes from the voltage VGSL to the voltage VSS according to the pulse width when the voltage VGS is supplied. The voltage of the (n+1)-th channel layer becomes the boost voltage VBSTH. The boost voltage VBSTH is higher than the boost voltage VBSTM. When the voltage of the (n+1)-th channel layer becomes the voltage VBSTH, the (n+1)-th channel layer is boosted. During the timing t31 to the timing t32 of the third-time second operation period as well, the voltage VGS is applied to the select gate lines SGD-n and SGS-n such that the select transistors ST1-$n$ and ST2-$n$ are turned on, the voltage VSS is applied to the n-th channel layer such that the n-th channel layer is not boosted, and the low level is applied to the control signal STB, as in the period from the timing t20 to the timing t21 of the first-time second operation period. In the third-time second operation period, the period from the timing t31 to the timing t32 is the boost period.

During the timing t32 to the timing t44 of the third-time second operation period, since the voltage of the (n+1)-th channel layer has become the boost voltage VBSTH, the (n+1)-th channel layer is maintained in the boosted state. Further, during the timing t32 to the timing t33 of the third-time second operation period, the high level is applied to the control signal STB, shifting from the low level, such that the control signal STB is asserted, and read data read from the memory cell transistor MC of the n-th channel layer based on a read voltage AR is transferred to the latch circuits (latch circuits ADL, BDL, and CDL) in the sense amplifier module 20. Further, during the timing t33 to the timing t34 of the third-time second operation period, the high level is applied to the control signal STB, shifting from the low level such that the control signal STB is asserted, and read data read from the memory cell transistor MC of the n-th channel layer based on a read voltage ER is transferred to the latch circuits (latch circuits ADL, BDL, and CDL) in the sense amplifier module 20. Since the voltages or the like applied to the signal lines or the like other than the (n+1)-th channel layer and the control signal STB from the timing t32 to the timing t40 of the third-time second operation period are the same as the voltages or the like applied from the timing t12 to the timing t20 of the first-time second operation period as described above, descriptions thereof are omitted herein.

In the third-time second operation period, the time during which the voltage is applied to the select gate lines SGD-n+1 and SGS-n+1 is shorter than that in the first-time and second-time second operation periods. As a result, since the boost period in the third-time second operation period may be longer than that in the first-time and second-time second operation periods, the boost voltage in the third-time second operation period may be made higher than that in the first-time and second-time second operation periods. Thus, the selected memory cell transistor MC in the n-th channel layer may be easily turned on.

While descriptions have been made on an example where the sequencer 15 supplies the two different read voltages (the read voltages AR and ER) to the selected word line WL-sel during the second operation, the voltages supplied by the sequencer 15 to the selected word line WL-sel are not limited to the example illustrated in FIG. 8. The voltages supplied by the sequencer 15 to the selected word line WL-sel may be, for example, the read voltages CR and FR, one read voltage, or three different read voltages.

As described above, in the read operation of the nonvolatile semiconductor storage device 1 according to the present embodiment, when the data of the memory cell transistor MC in the n-th channel layer is read, the sequencer 15 executes the second operation multiple times, and changes the pulse width of the voltage applied to the select gate lines SGD-n+1 and SGS-n+1 for each of the second operations executed multiples times. As a result, since the boost voltage applied to the channel layer may be changed for each of the second operations executed multiple times, forming the channel of the memory cell transistor MC may be changed more easily, so that turning on the memory cell transistor MC may be changed more easily.

Further, in the read operation of the nonvolatile semiconductor storage device 1 according to the present embodiment, since the sequencer 15 executes the first operation to supply the three different read voltages to the selected word line WL-sel, the data of the memory cell transistor MC of the n-th channel layer may be determined by using at least three different read results. In determining the data of the memory cell transistor MC of the n-th channel layer, it is possible to choose one result among the three different read results, to be used for determining the data of the memory cell transistor MC, for each memory cell transistor MC.

For example, when the read result of the memory cell transistor MC in the (n+1)-th channel layer indicates that the threshold voltage thereof is higher than, for example, the read voltage FR, it may be understood that the memory cell transistor MC in the n-th channel layer is significantly interfered by the coupling with the memory cell transistor MC of the (n+1)-th channel layer. As a result, the threshold voltage of the memory cell transistor MC in the n-th channel layer may be determined to be significantly high. Thus, in order to eliminate the large interference with the memory cell transistor MC of the (n+1)-th channel layer, for example, the data obtained as a result of the third-time second operation is selected as the read data from the memory cell transistor MC of the n-th channel layer.

<10. Another Example of Read Operation>

FIG. 9 is a timing chart illustrating another example of the voltages applied to various circuit components used during the read operation in the nonvolatile semiconductor storage device 1 according to the present embodiment. The timing chart illustrated in FIG. 9 is different from the timing chart illustrated in FIG. 8 in terms of a portion of the second operation period. Specifically, the timing chart illustrated in FIG. 9 is different from the timing chart illustrated in FIG. 8, in terms of the operation during the timing t1 to the timing t11 of the first-time second operation period, the operation during the timing t2 to the timing t21 of the second-time second operation period, and the operation during the timing t3 to the timing t31 of the third-time second operation period. Here, descriptions will be made focusing on the differences between the timing chart illustrated in FIG. 9 and the timing chart illustrated in FIG. 8. The descriptions of the same or similar configuration as that shown in FIGS. 1 to 8 may be omitted.

Similarly to the timing chart of FIG. 8, the timing chart illustrated in FIG. 9 is a timing chart representing the voltages applied to the various circuit components, and does not illustrate, for example, the voltages supplied to the word lines and the voltage variations of the select gate lines SGD and SGS. Further, the timing chart illustrated in FIG. 9 is a timing chart illustrating an example of the read operation, and the timing chart of the nonvolatile semiconductor storage device according to the present embodiment is not limited to the example illustrated in FIG. 9.

Hereinafter, an example of the second operation of the read operation of the nonvolatile semiconductor storage device 1 according to the present embodiment will be described in detail. First, the voltage or the like applied to each signal line from the timing t1 to the timing t10 of the first-time second operation period will be described. The voltage VSS is applied to each of the selected word line WL_sel, the non-selected word line WL_usel, the select gate lines SGD-n and SGS-n, the n-th channel layer, and the (n+1)-th channel layer. When the voltage VSS is applied to the (n+1)-th channel layer and the n-th channel layer, the (n+1)-th channel layer and the n-th channel layer are not boosted. The voltage applied to the select gate lines SGD-n+1 and SGS-n+1 changes from the voltage VSS to the voltage VGS according to the pulse width when the voltage VGS is supplied. The voltage VGS is a voltage that turns on the select transistors ST1-$n$+1 and ST2-$n$+1. Further, the low level is applied to the control signal STB.

The voltage or the like applied to each signal line from the timing t10 to the timing t11 of the first-time second operation period will be described. The voltage VSS is applied to the selected word line WL_sel. The read pass voltage VREAD is applied to the non-selected word line WL_usel. The voltage applied to the select gate lines SGD-n+1 and SGS-n+1 is the voltage VGS. Further, the voltage VSS is applied to each of the n-th channel layer and the (n+1)-th channel layer. The n-th channel layer and the (n+1)-th channel layer are not boosted. Further, the voltage VGS is applied to the select gate lines SGD-n and SGS-n. The voltage VGS is a voltage that turns on the select transistors ST1-$n$ and ST2-$n$. The low level is applied to the control signal STB.

The voltage or the like applied to each signal line from the timing t11 to the timing t12 of the second-time second operation period will be described. The voltage VSS is applied to the selected word line WL_sel. The read pass voltage VREAD is applied to the non-selected word line WL_usel. The voltage applied to the select gate lines SGD-n+1 and SGS-n+1 changes from the voltage VGS to the voltage VSS. The voltage of the (n+1)-th channel layer becomes the boost voltage VBSTL. When the voltage of the (n+1)-th channel layer becomes the voltage VBSTL, the (n+1)-th channel layer is boosted. The voltage VGS is applied to the select gate lines SGD-n and SGS-n such that the select transistors ST1-$n$ and ST2-$n$ are turned on, the voltage VSS is applied to the n-th channel layer such that the n-th channel layer is not boosted, and the low level is applied to the control signal STB. In the second-time second operation period, the period from the timing t11 to the timing t12 is the boost period.

Since the voltages or the like applied to the signal lines or the like from the timing t12 to the timing t2 of the first-time second operation period in the timing chart illustrated in FIG. 9 are the same as the voltages or the like applied from the timing t12 to the timing t20 of the first-time second operation period as described above, descriptions thereof are omitted herein.

Next, the second-time second operation will be described. Since the voltage or the like applied to each signal line from the timing t2 to the timing t21 of the second-time second operation period is the same as the voltage or the like applied to each signal line from the timing t1 to the timing t11 of the first-time second operation period, descriptions thereof are omitted herein.

The voltage applied to the select gate lines SGD-n+1 and SGS-n+1 from the timing t21 to the timing t22 of the second-time second operation period changes from the voltage VGS to the voltage VSS. Since the voltage or the like applied to each signal line other than the select gate lines SGD-n+1 and SGS-n+1 is the same as the voltage or the like applied from the timing t21 to the timing t22 of the second-time second operation period in the timing chart illustrated in FIG. 8 as described above, descriptions thereof are omitted herein. Further, since the voltages or the like applied to the signal lines or the like from the timing t22 to the timing t3 of the second-time second operation period in the timing chart illustrated in FIG. 9 are the same as the voltages or the like applied from the timing t22 to the timing t30 of the second-time second operation period in the timing chart illustrated in FIG. 8 as described above, descriptions thereof are omitted herein.

Since the voltage or the like applied to each signal line from the timing t3 to the timing t31 of the third-time second operation period is the same as the voltage or the like applied to each signal line from the timing t1 to the timing t11 of the first-time second operation period, descriptions thereof are omitted herein.

The voltage applied to the select gate lines SGD-n+1 and SGS-n+1 from the timing t31 to the timing t32 of the third-time second operation period changes from the voltage VGS to the voltage VSS. Since the voltage or the like applied to each signal line other than the select gate lines SGD-n+1 and SGS-n+1 is the same as the voltage or the like applied from the timing t31 to the timing t32 of the third-time second operation period in the timing chart illustrated in FIG. 8 as described above, descriptions thereof are omitted herein. Further, since the voltages or the like applied to the signal lines or the like from the timing t32 to the timing t34 of the third-time second operation period in the timing chart illustrated in FIG. 9 are the same as the voltages or the like applied from the timing t32 to the timing t34 of the third-time second operation period in the timing chart illustrated in FIG. 8 as described above, descriptions thereof are omitted herein.

In the second operation of the read operation of the nonvolatile semiconductor storage device 1 according to the present embodiment in the timing chart illustrated in FIG. 9, a voltage is applied in a pulse form to the select gate lines SGD-n+1 and SGS-n+1, such that the select transistors ST1-$n$+1 and ST2-$n$+1 shift from the ON state to the OFF state, and the voltage of the (n+1)-th channel layer becomes the boost voltage. Simultaneously, the voltage VGS is applied to the select gate lines SGD-n and SGS-n such that the select transistors ST1-$n$ and ST2-$n$ are turned on, and the n-th channel layer is not boosted so that the selected memory cell transistor MC in the n-th channel layer may be easily turned on.

Further, in the second operation the read operation of the nonvolatile semiconductor storage device 1 according to the present embodiment in the timing chart illustrated in FIG. 9, the time during which the voltage is applied to the select gate lines SGD-n+1 and SGS-n+1 in the second-time second operation period is shorter than that in the first-time second operation period. Further, the time in which the voltage is applied to the select gate lines SGD-n+1 and SGS-n+1 in the third-time second operation period is shorter than that in the first- and second-time second operation periods. That is, the pulse width in which the voltage VGS is applied to the select gate lines SGD-n+1 and SGS-n+1 in the second-time second operation period is shorter than the pulse width in which the voltage VGS is applied to the select gate lines SGD-n+1 and SGS-n+1 in the first-time second operation period, and the pulse width in which the voltage VGS is applied to the select gate lines SGD-n+1 and SGS-n+1 in the third-time second operation period is shorter than the pulse width in which the voltage VGS is applied to the select gate lines SGD-n+1 and SGS-n+1 in the second-time second operation period. As a result, the boost period in the second-time second operation period may be made longer than that in the first-time second operation period, and the boost period in the third-time second operation period may be made longer than that in the second-time second operation period. Accordingly, the boost voltage in the second-time second operation period may be made higher than that in the first-time second operation period, and the boost voltage in the third-time second operation period may be made higher than that in the second-time second operation period. Accordingly, as the pulse width in which the voltage VGS is applied to the select gate lines SGD-n+1 and SGS-n+1 is shorter, the boost voltage of the (n+1)-th channel layer is higher, so that the selected memory cell transistor MC in the n-th channel layer may be easily turned on.

When the nonvolatile semiconductor storage device 1 according to the present embodiment operates based on the timing chart illustrated in FIG. 9, the same operational effects may be obtained as those obtained when the nonvolatile semiconductor storage device 1 according to the present embodiment operates based on the timing chart illustrated in FIG. 8.

Other Embodiments

Each unit described above as a component in the semiconductor storage device according to the first and second embodiments may be implemented by either hardware or software, or may be implemented by a combination of hardware and software.

In the embodiments described above, when the terms "similar or the same" are used, an error may be allowed in the range of the design.

The terms "applying or supplying a certain voltage" include controlling the application or supply of the voltage and actually applying or supplying the voltage. Applying or supplying a certain voltage may include applying or supplying a voltage of 0 V.

In the present descriptions, the "connection" indicates an electric connection, and includes a connection via another element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor storage device comprising:
   a substrate having a main surface that extends in a first direction and a second direction crossing the first direction;
   a bit line that extends in a third direction crossing the first and second directions;
   a source line that extends in the third direction;
   a first channel layer that is disposed on the one side of the substrate in the third direction, and includes a first drain-side select transistor that is connected to the bit line, a first source-side select transistor that is connected to the source line, and a first memory cell transistor connected between the first drain-side select transistor and the first source-side select transistor;
   a second channel layer that is disposed on one side of the first channel layer in the third direction, and includes a second drain-side select transistor that is connected to the bit line, a second source-side select transistor connected to the source line, and a second memory cell transistor connected between the second drain-side select transistor and the second source-side select transistor;
   a word line that is disposed on one side of the first channel layer and the second channel layer in the second direction, extends in the third direction, and functions as a gate electrode of the first memory cell transistor and the second memory cell transistor; and
   a controller,
   wherein when a read operation is executed on the first memory cell transistor, the controller executes
   a first operation to turn on the second drain-side select transistor and the second source-side select transistor, and simultaneously, supply at least one first read voltage to the word line in a state where the first drain-side select transistor and the first source-side select transistor are turned off, and
   a second operation to supply at least one second read voltage to the word line in a state where at least the first drain-side select transistor and the first source-side select transistor are turned on, after the first operation.

2. The nonvolatile semiconductor storage device according to claim 1, wherein
   in the first operation, the controller does not supply the at least one first read voltage to the word line in a state where the first drain-side select transistor and the first source-side select transistor are turned on, and supplies the at least one first read voltage to the word line in a state where the first drain-side select transistor and the first source-side select transistor are turned off.

3. The nonvolatile semiconductor storage device according to claim 2, wherein the controller
   repeats the second operation a number of times,
   supplies a third voltage to the second drain-side select transistor and the second source-side select transistor for a first period of time and thereafter turns off the second drain-side select transistor and the second source-side select transistor, when the second operation is carried out the first time and while at least the first drain-side select transistor and the first source-side select transistor are turned on, and
   supplies the third voltage to the second drain-side select transistor and the second source-side select transistor for a second period of time that is shorter than the first period of time and thereafter turns off the second drain-side select transistor and the second source-side select transistor, when the second operation is carried out the second time and while at least the first drain-side select transistor and the first source-side select transistor are turned on.

4. The nonvolatile semiconductor storage device according to claim 3, wherein the controller supplies the third voltage to the second drain-side select transistor and the second source-side select transistor for a third period of time that is shorter than the second period of time and thereafter turns off the second drain-side select transistor and the second source-side select transistor, when the second operation is carried out the third time and at least the first drain-side select transistor and the first source-side select transistor are turned on.

5. The nonvolatile semiconductor storage device according to claim 4, wherein a highest voltage applied to the second drain-side select transistor and the second source-side select transistor during the first period of time is greater than that applied during the second period of time, which is greater than that applied during the third period of time.

6. The nonvolatile semiconductor storage device according to claim 5, wherein
when the controller turns off the second drain-side select transistor and the second source-side select transistor after each of the first, second, and third periods of time, a voltage of the second channel layer is boosted by first, second, and third amounts, wherein the first amount is less than the second amount, which is less than the third amount.

7. The nonvolatile semiconductor storage device according to claim 4, wherein a highest voltage applied to the second drain-side select transistor and the second source-side select transistor during the first period of time is the same as those applied during the second period of time and the third period of time.

8. The nonvolatile semiconductor storage device according to claim 3, wherein data stored in the first memory cell transistor is read during each one of the second operations and a read result from one of the second operations is used to determine the data stored in the first memory cell transistor.

9. The nonvolatile semiconductor storage device according to claim 8, wherein the read result from one of the second operations is selected based on a threshold voltage level of the second memory cell transistor determined from the first read operation.

10. The nonvolatile semiconductor storage device according to claim 1, wherein
during the first operation, two first read voltages are supplied to the word line in sequence.

11. A method of performing a read operation on a first memory cell transistor in a nonvolatile semiconductor storage device comprising:
a substrate having a main surface that extends in a first direction and a second direction crossing the first direction;
a bit line that extends in a third direction crossing the first and second directions;
a source line that extends in the third direction;
a first channel layer that is disposed on the one side of the substrate in the third direction, and includes a first drain-side select transistor that is connected to the bit line, a first source-side select transistor that is connected to the source line, and the first memory cell transistor connected between the first drain-side select transistor and the first source-side select transistor;
a second channel layer that is disposed on one side of the first channel layer in the third direction, and includes a second drain-side select transistor that is connected to the bit line, a second source-side select transistor connected to the source line, and a second memory cell transistor connected between the second drain-side select transistor and the second source-side select transistor; and
a word line that is disposed on one side of the first channel layer and the second channel layer in the second direction, extends in the third direction, and functions as a gate electrode of the first memory cell transistor and the second memory cell transistor,
wherein said method includes
a first operation to turn on the second drain-side select transistor and the second source-side select transistor, and simultaneously, supply at least one first read voltage to the word line in a state where the first drain-side select transistor and the first source-side select transistor are turned off, and
a second operation to supply at least one second read voltage to the word line in a state where at least the first drain-side select transistor and the first source-side select transistor are turned on, after the first operation.

12. The method according to claim 11, wherein
in the first operation, the at least one first read voltage is not supplied to the word line in a state where the first drain-side select transistor and the first source-side select transistor are turned on, and the at least one first read voltage is supplied to the word line in a state where the first drain-side select transistor and the first source-side select transistor are turned off.

13. The method according to claim 12, wherein the second operation is repeated a number of times, and wherein
when the second operation is carried out the first time and at least the first drain-side select transistor and while the first source-side select transistor are turned on, a third voltage is supplied to the second drain-side select transistor and the second source-side select transistor for a first period of time and thereafter the second drain-side select transistor and the second source-side select transistor are turned off, and
when the second operation is carried out the second time and at least the first drain-side select transistor and while the first source-side select transistor are turned on, the third voltage is supplied to the second drain-side select transistor and the second source-side select transistor for a second period of time that is shorter than the first period of time and thereafter the second drain-side select transistor and the second source-side select transistor are turned off.

14. The method according to claim 13, wherein
when the second operation is carried out the third time and while at least the first drain-side select transistor and the first source-side select transistor are turned on, the third voltage is supplied to the second drain-side select transistor and the second source-side select transistor for a third period of time that is shorter than the second period of time and thereafter the second drain-side select transistor and the second source-side select transistor are turned off.

15. The method according to claim 14, wherein a highest voltage applied to the second drain-side select transistor and the second source-side select transistor during the first period of time is greater than that applied during the second period of time, which is greater than that applied during the third period of time.

16. The method according to claim 15, wherein
when the second drain-side select transistor and the second source-side select transistor are turned off after each of the first, second, and third periods of time, a voltage of the second channel layer is boosted by first, second, and third amounts, wherein the first amount is less than the second amount, which is less than the third amount.

17. The method according to claim 14, wherein a highest voltage applied to the second drain-side select transistor and the second source-side select transistor during the first period of time is the same as those applied during the second period of time and the third period of time.

18. The method according to claim 13, wherein data stored in the first memory cell transistor is read during each one of the second operations and a read result from one of the second operations is used to determine the data stored in the first memory cell transistor.

19. The method according to claim 18, wherein the read result from one of the second operations is selected based on a threshold voltage level of the second memory cell transistor determined from the first read operation.

20. The method according to claim 11, wherein
during the first operation, two first read voltages are supplied to the word line in sequence.

\* \* \* \* \*